(12) United States Patent
Okumura

(10) Patent No.: US 10,468,509 B2
(45) Date of Patent: Nov. 5, 2019

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/974,043

(22) Filed: May 8, 2018

(65) Prior Publication Data

US 2018/0358454 A1 Dec. 13, 2018

(30) Foreign Application Priority Data

Jun. 7, 2017 (JP) .................................. 2017-112597

(51) Int. Cl.
*H01L 29/06* (2006.01)
*H01L 29/739* (2006.01)
*H01L 29/16* (2006.01)
*H01L 29/66* (2006.01)
*H01L 29/10* (2006.01)

(52) U.S. Cl.
CPC ...... *H01L 29/7395* (2013.01); *H01L 29/1095* (2013.01); *H01L 29/1608* (2013.01); *H01L 29/66333* (2013.01)

(58) Field of Classification Search
CPC .......................... H01L 29/0623; H01L 29/0684
See application file for complete search history.

(56) References Cited

U.S. PATENT DOCUMENTS

| | | | | |
|---|---|---|---|---|
| 2014/0175459 A1* | 6/2014 | Yamamoto | .......... | H01L 29/1095 257/77 |
| 2015/0221731 A1* | 8/2015 | Zeng | ..................... | H01L 29/407 257/139 |
| 2016/0359029 A1* | 12/2016 | Zeng | .................. | H01L 29/7397 |

FOREIGN PATENT DOCUMENTS

JP  4738562 B2  8/2011

* cited by examiner

*Primary Examiner* — Thomas L Dickey
(74) *Attorney, Agent, or Firm* — Chen Yoshimura LLP

(57) ABSTRACT

A semiconductor device includes: an n-type drift region; a p-type base region above the drift region; a gate electrode disposed inside a trench above the drift region with a gate insulating film between the trench and the gate electrode; an n-type source region above the base region; a source electrode connected to the source region; an n-type drain region below the drift region; a drain electrode connected to the drain region; a p-type protective layer that is disposed inside the drift region and below the trench, the protective layer protruding beyond a trench width of the trench; and a p-type conductive path formation layer that is disposed between the protective layer and a bottom of the trench and protrudes beyond the trench width, the conductive path formation layer having protruding regions of which an impurity concentration therein is set so that an inversion layer is formed during ON.

11 Claims, 20 Drawing Sheets

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

When a reverse bias voltage is applied during turn-off (hereinafter, simply "OFF") in a trench type MOSFET etc. that uses a silicon carbide (SiC) semiconductor, there are cases where a high voltage is applied across the drain-source, which degrades the quality of the gate insulating film. When the reverse bias voltage is applied, the portion of the gate insulating film on the bottom of the trench is the most susceptible to being damaged.

Patent Document 1, for example, discloses a technique to protect the gate insulating film at the bottom of the trench by providing a high concentration p-type electric field shield region directly below the trench, thereby protecting the gate insulating film from high voltages during OFF. However, in the technique disclosed in Patent Document 1, the electric field shield region obstructs the path of main current during turn-on (hereinafter, simply "ON"). Due to this, there is a problem with increases in the increased component of ON-resistance (JFET resistance) caused by the junction field effect transistor (JFET) effect in which depletion layers spread from adjacent channel regions and narrow the path of the main current.

RELATED ART DOCUMENT

Patent Document

Patent Document 1: Japanese Patent No. 4738562

SUMMARY OF THE INVENTION

The present invention was made in view of the aforementioned problem and aims at providing a semiconductor device capable of both protecting the gate insulating film at the bottom of the trench and reducing ON-resistance, and providing a method of manufacturing the semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device including: (a) a drift region of a first conductivity type made of semiconductor; (b) a base region of a second conductivity type made of semiconductor, disposed above the drift region, wherein a trench is provided penetrating the base region and reaching the drift region; (c) a gate insulating film disposed inside of the trench; (d) a gate electrode embedded inside the trench with the gate insulating film interposed between the trench and the gate electrode; (e) a first high-impurity region of the first conductivity type disposed above the base region; (f) a second high-impurity region of the first conductivity type disposed below the drift region; (g) a protective layer of the second conductivity type that is disposed inside the drift region below a bottom of the trench, the protective layer protruding laterally beyond a width of the trench on both sides; and (h) a conductive path formation layer of the second conductivity type that is disposed between, and in contact with, the protective layer and the bottom of the trench, the conductive path formation layer having protruding regions that protrude laterally beyond the width of the trench on both sides, an impurity concentration of the protruding regions being such that an inversion layer is formed therein when the semiconductor device is turned on to form an inversion layer in a portion of the base region opposing to the gate electrode.

In another aspect, the present disclosure provides a method of manufacturing a semiconductor device, the method including: (i) forming a base region of a second conductivity type made of semiconductor, above a drift region of a first conductivity type made of semiconductor; (j) forming a trench penetrating the base region and reaching the drift region; (k) forming a gate insulating film along the trench; (l) forming a gate electrode inside the trench with the gate insulating film interposed between the trench and the gate electrode; (m) forming a first high-impurity region of the first conductivity type above the base region; (n) forming a second high-impurity region of the first conductivity type below the drift region; (o) forming a protective layer of the second conductivity type inside the drift region below a bottom of the trench such that the protective layer protrudes laterally beyond a width of a trench on both sides; and (p) forming a conductive path formation layer of the second conductivity type between, and in contact with, the protective layer and the bottom of the trench, the conductive path formation layer having protrusion regions that protrude laterally beyond the width of the trench on both sides, an impurity concentration of the protrusion regions being such that an inversion layer is formed therein when the semiconductor device is turned on to form an inversion layer in a portion of the base region opposing to the gate electrode.

The present invention makes it possible to provide a semiconductor device capable of both protecting the gate insulating film at the bottom of the trench and reducing ON-resistance, and to provide a method of manufacturing the semiconductor device.

It is to be understood that both the foregoing general description and the following detailed description are exemplary and explanatory, and are intended to provide further explanation of the invention as claimed.

DETAILED DESCRIPTION OF EMBODIMENTS

Figure 1:
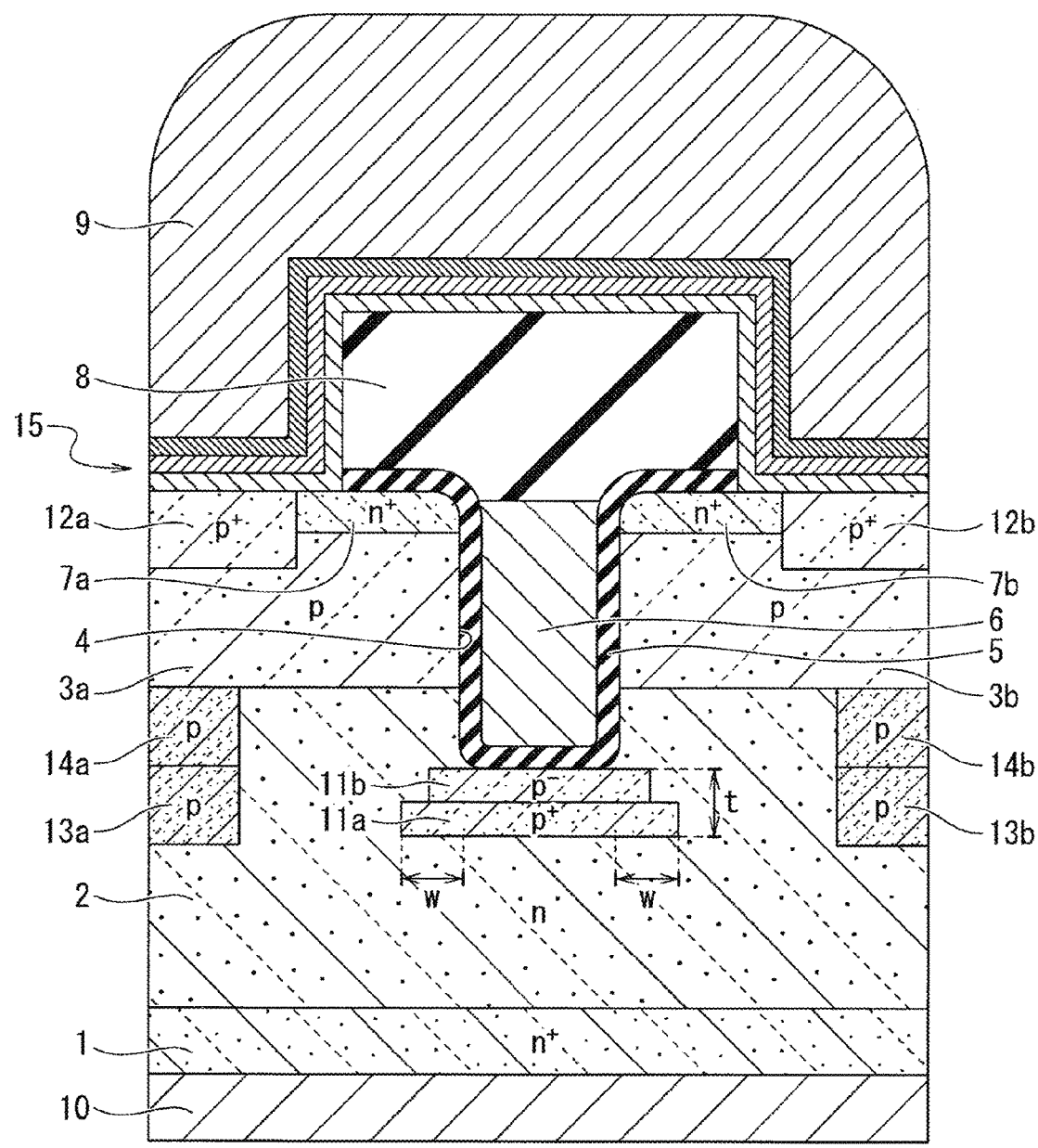
FIG. 1 is a cross-sectional view that schematically describes a general configuration of a semiconductor device in an embodiment of the present invention.

Embodiments of the present invention will be described below. In the drawings, portions that are the same or similar will be assigned the same or similar reference characters. However, it should be noted that the drawings are schematic, and that relation between thickness and planar dimensions, and the ratios etc. among the thicknesses of the respective devices and members differ in practice. Thus, specific thicknesses and dimensions should be determined in reference to the description below. Furthermore, there are naturally portions that differ in dimensional relations and ratios between the drawings.

In addition, the directions of "left-right" and "top-bottom" in the descriptions below are merely definitions for convenience of explanation and do not limit the technical spirit of the present invention. Accordingly, if the sheet of paper were turned by 90 degrees, for example, then "left and right" and "top and bottom" would be switched, and if the sheet of paper were rotated 180 degrees, then naturally "left" would become "right" and "right" would become "left." Furthermore, in the description of the embodiment below, the first conductivity type is illustratively described as n-type and the second conductivity type as p-type, but the conductivity types may be reversed, where the first conductivity type is p-type and the second conductivity type is n-type. A "+" or "−" attached to an "n" or "p" signifies that the impurity element concentration is higher or lower, respectively, than a semiconductor region not having the "+" or "−".

In the present specification, the "first main electrode region" means either a source region or a drain layer in a field effect transistor (FET) or static induction transistor (SIT). In an insulated gate bipolar transistor (IGBT), "first main electrode region" means a semiconductor region serving as either the emitter region or collector region. Furthermore, in the FET and SIT, the "second main electrode region" means a semiconductor region serving as whichever of the source region or drain layer that is not the first main electrode region. In the IGBT, the "second main electrode region" means a region serving as whichever of the emitter region or collector region that is not the first main electrode region.

<Semiconductor Device>

As shown in FIG. 1, a semiconductor device of the embodiment in the present invention is a MOSFET that includes an n-type drift region 2 using an SiC semiconductor substrate, and a plurality of p-type base regions 3a, 3b provided above the drift region 2. The part above the drift region 2 is provided with a trench 4 extending from the base regions 3a, 3b to the drift region 2.

The semiconductor device shown in FIG. 1 focuses on one trench 4 in the semiconductor device of the embodiment in the present invention and the region surrounding the trench 4. In practice, a plurality of the trenches 4 are provided, and the trenches each extend in parallel to each other with gaps therebetween along the direction going through the sheet of paper on which the drawing is depicted. The semiconductor device of the embodiment in the present invention is formed by a structure such as that shown in FIG. 1 being repeatedly formed and integrated on both the left and right sides of FIG. 1.

Furthermore, the semiconductor device shown in FIG. 1 includes a gate insulating film 5 disposed inside the trench 4, a gate electrode 6 disposed inside the trench 4 with the gate insulating film 5 being interposed between the gate electrode and the trench, and an interlayer insulating film 8 disposed on the surface of the gate electrode 6. The concentration of the impurity element (impurity density) of the base regions 3a, 3b is approximately $4.0 \times 10^{17}$ cm$^{-3}$, for example, and the conductivity type of the channel region is inverted by applying a prescribed gate voltage to the gate electrode 6 while a positive bias is applied to the channel region.

A plurality of p$^+$-type base contact regions 12a, 12b are provided in the top part inside the plurality of p-type base regions 3a, 3b between adjacent trenches 4. P-type first "below-contact" base regions 13a, 13b and p-type second "below-contact" base regions 14a, 14b are laminated from bottom to top in the stated order directly below the base regions 3a, 3b positioned below the base contact regions 12a, 12b.

The semiconductor device shown in FIG. 1 also includes a plurality of n$^+$-type source regions 7a, 7b selectively disposed in the top part inside the p-type base regions 3a, 3b, and a source electrode 9 disposed above the source regions 7a, 7b with a barrier metal layer 15 interposed therebetween. The source regions 7a, 7b correspond to the "first main electrode regions" (first high-impurity region) in the present invention. The source electrode 9 is connected to the source regions 7a, 7b. The barrier metal layer 15 is a three-layer structure such as titanium (Ti), titanium nitride (TiN), and the like disposed above the drift region 2 and over the top surfaces of the interlayer insulating film 8, source regions 7a, 7b, and base contact regions 12a, 12b. The barrier metal layer 15 suppresses the growth of silicon (Si) nodules and suppresses the diffusion of aluminum (Al) contained in the source electrode 9. A nickel silicide layer (not shown) is disposed in a contact part of the barrier metal layer 15 and source regions 7a, 7b and base contact regions 12a, 12b to form an Ohmic contact.

A passivation film or the like such as a polyimide film is deposited as the outermost layer above the top surface of the source electrode 9, and a main surface of the source electrode 9 located underneath is exposed at a window (opening) formed in the passivation film or the like. The exposed main surface of the source electrode 9 can be used as a source bonding pad. Similarly, a wiring layer connected to the gate electrode 6 is exposed at a window formed in the passivation film or the like at a different location from the source electrode 9. The exposed portion of the wiring layer can be used as a gate bonding pad. The passivation film, bonding pad, etc. are not shown in the drawings.

The semiconductor device shown in FIG. 1 also includes an n$^+$-type drain region 1 disposed in a layer pattern below the drift region 2, and a drain electrode 10 disposed below the drain region 1 and connected to the drain region 1. The drain region corresponds to the "second main electrode region" (second high-impurity region) in the present invention.

A p-type protective layer 11a that protrudes further outside than the trench width of the trench 4, and a p-type conductive path formation layer 11b provided between the protective layer 11a and bottom of the trench 4 are further provided inside the drift region 2 below the trench 4. The conductive path formation layer 11b protrudes further outward than the trench width of the trench 4 by a fixed amount, and the impurity element concentration and the thickness of the protruding regions are set so as to invert to n-type during ON. The protective layer 11a and conductive path formation layer 11b form a two-layer structure protective conduction region (11a, 11b).

The protective conduction region (11a, 11b) is disposed at approximately the same height as the first below-contact base regions 13a, 13b below the base contact regions 12a, 12b. The protective conduction region (11a, 11b) has a thickness t that is approximately the same as the first below-contact base regions 13a, 13b, and the top surface of the protective conduction region contacts the bottom surface of the gate insulating film 5 at the bottom of the trench 4. The protective layer 11a and the conductive path formation layer 11b of the protective conduction region (11a, 11b) both have the rectangular cross-sectional shape shown in FIG. 1 and extend parallel along the trench 4, which extends in the direction going through the sheet of paper inside the drift region 2.

The protective layer 11a is formed so as to be p$^+$-type with a high concentration of approximately $5.0 \times 10^{18}$ cm$^{-3}$ in order to protect the gate insulating film 5 during OFF. The protruding width w of both ends of the rectangle of the protective film 11a is longer than the protruding width of both ends of the rectangle of the conductive path formation layer 11b. Therefore, the cross-sectional shape of the entire protective conduction region (11a, 11b) made of the protective layer 11a and conductive path formation layer 11b is a step-like shape in which, from the bottom side to the top side, both ends go from the outside toward the inside of the trench 4.

The conductive path formation layer 11b is disposed directly above the protective layer 11a, and forms an inversion layer during ON. The upper limit value for the p-type impurity element concentration of the conductive path formation layer 11b is set to be less than or equal to a concentration at which the thickness portion of the conductive path formation layer 11b can invert to n-type when an ON voltage is applied. As one example of the conductive path formation layer 11b inverting to n-type, the impurity element concentration of the conductive path formation layer 11b can be set to be lower than the impurity element concentration of the base regions 3a, 3b. Meanwhile, the lower limit value for the p-type impurity element concentration of the conductive path formation layer 11b is set to be greater than or equal to at least the impurity element concentration of the n-type drift region 2 so that the conductivity type can remain p-type during OFF. Specifically, if the semiconductor device is a 1200 V-class device, then the value would be set to approximately $8.0 \times 10^{15}$ cm$^{-3}$ or higher, for example. Furthermore, the impurity element concentration of the protective layer 11a can be set as the same as the impurity element concentration of the conductive path formation layer 11b.

In the conductive path formation layer 11b of the semiconductor device of the embodiment in the present invention, in addition to the concentration, the thickness thereof is also set so as to be able to reliably form an inversion layer during ON. Specifically, it is preferable that the protruding width of both ends of the conductive path formation layer 11b be approximately 0.1 μm to 0.5 μm, and the thickness be less than or equal to 10 nm. If the protruding width and thickness exceed the respective upper limit values, then there would be a risk that the inversion layer would not be able to sufficiently form.

The total thickness t of the protective conduction region (11a, 11b) is set so as to be able to both form the inversion layer in the conductive path formation layer 11b and to protect the gate insulating film 5 with the protective layer 11a. If the semiconductor device is a 1200 V-class device, the total thickness t is approximately 0.2 μm to 0.6 μm.

Figure 2:
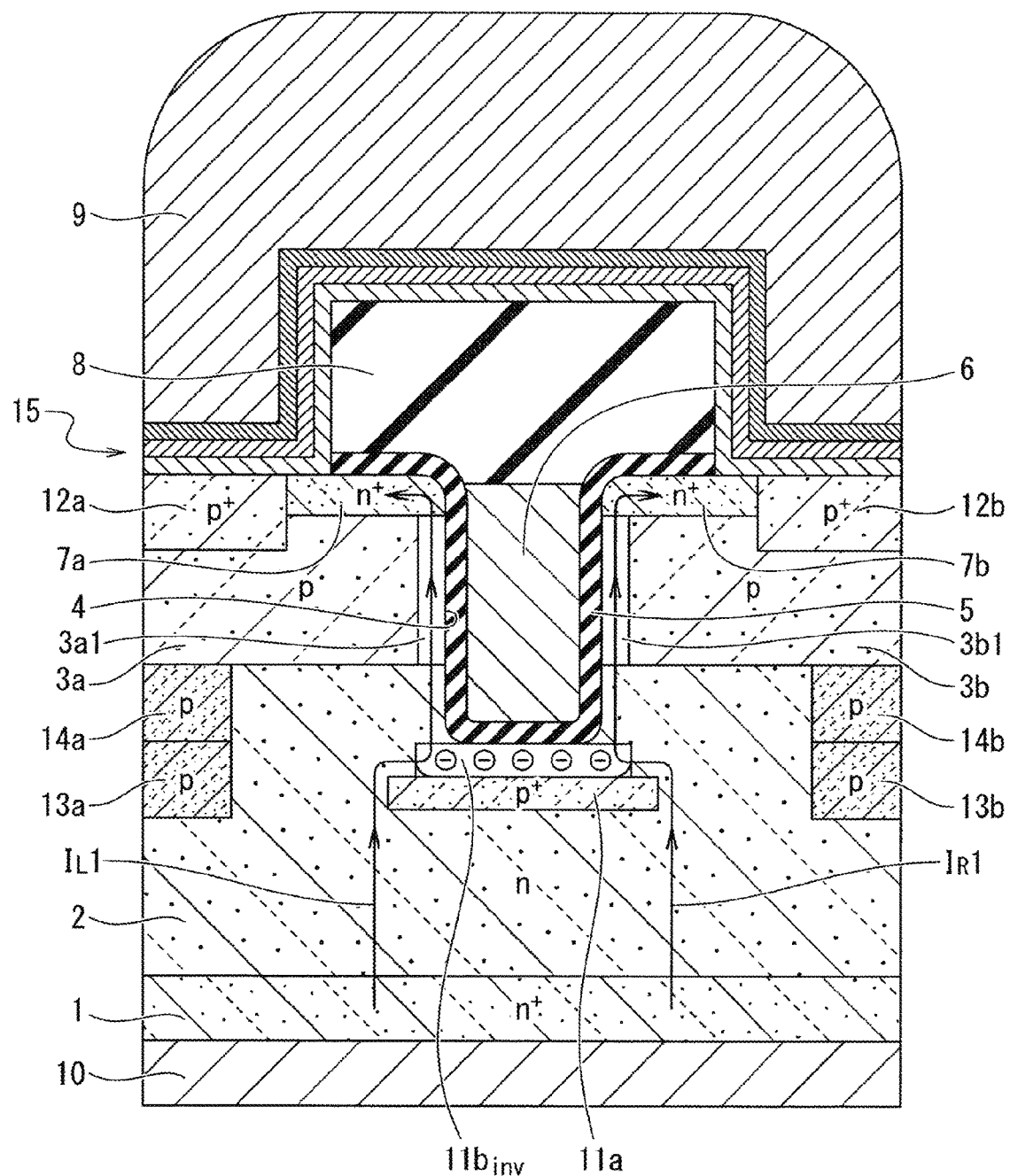
FIG. 2 is a cross-sectional view that schematically describes a general state of main currents flowing to the semiconductor device in the embodiment of the present invention.

As shown in FIG. 2, in the semiconductor device of the embodiment in the present invention in a case where the drain region 1 is biased to a positive potential, an inversion layer $11b_{inv}$ in which the conductivity type is inverted from p-type to n-type is formed during ON inside the conductive path formation layer 11b.

Main currents $I_L1$, $I_R1$ flow from the drain region 1 toward the source regions 7a, 7b along the respective left and right side walls of the trench 4. The flow of the main currents $I_L1$, $I_R1$ goes up along the sides of the protective layer 11a in the n-type drift region 2, reaches the upper side of the protective layer 11a, and thereafter has an orientation change of approximately 90 degrees to go along the top surface of the ends of the protective layer 11a. The main currents $I_L1$, $I_R1$ then enter inside the ends of the inversion layer $11b_{inv}$.

Thereafter, the main currents $I_L1$, $I_R1$ have an orientation change of approximately 90 degrees inside the inversion layer $11b_{inv}$ to go along the side walls of the trench 4. Then, the main currents $I_L1$, $I_R1$ exit to outside from the top side of the ends of the inversion layer $11b_{inv}$ and again enter into the drift region 2. After this, the flow of the main currents $I_L1$, $I_R1$ goes toward the upper side along the side walls of the trench 4, goes through inversion layers of channel regions 3a1, 3b1 formed in the base regions 3a, 3b, and reaches the source regions 7a, 7b.

In other words, the main currents $I_L1$, $I_R1$ do not flow along the corners of the ends of the conductive path formation layer 11b of the protective conduction region (11a, 11b), but rather flow through the inside of the inversion layer $11b_{inv}$ of the conductive path formation layer 11b to go toward the channel regions 3a1, 3b1. In FIG. 2, the hatching of the inversion layer portions of the channel regions 3a1, 3b1 is omitted for ease of viewing.

Comparative Example

Figure 3:
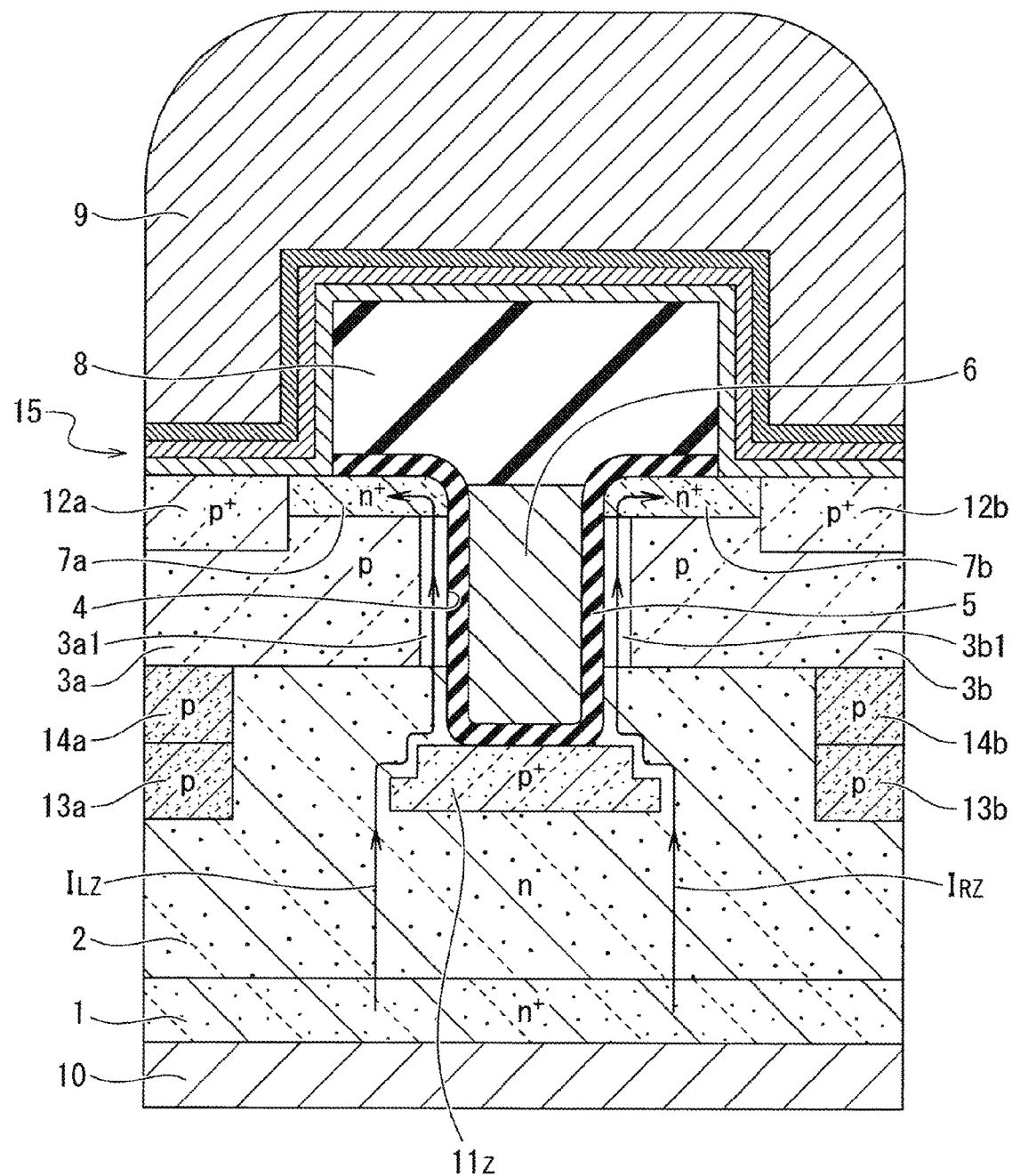
FIG. 3 is a cross-sectional view that schematically describes a general state of main currents flowing to a semiconductor device in a comparative example.

As shown in FIG. 3, in the case of a semiconductor device of a comparative example that does not have the conductive path formation layer, main currents $I_LZ$, $I_RZ$ during ON flow along the step-like shape of the ends of the protective layer 11z. In comparison to the semiconductor device of the embodiment in the present invention, the semiconductor device of the comparison example does not have the two-layer protective conduction region (11a, 11b) containing the conductive path formation layer 11b, but rather has only a one-layer protective layer 11z. In other words, the shape of the outer edges of the protective layer 11z in the semiconductor device of the comparative example is equivalent to the shape of the outer edges of the protective conduction region (11a, 11b) in the semiconductor device of the embodiment in the present invention, but the conductivity type therein is only high-concentration p⁺-type, and thus an inversion layer will not be formed. The impurity element concentration of the protective layer 11z in the semiconductor device of the comparative example is approximately $5.0 \times 10^{18}$ cm$^{-3}$, for example. Meanwhile, the impurity element concentration of the conductive path formation layer 11b of the protective conduction region (11a, 11b) in the semiconductor device of the embodiment in the present invention is set to be low at approximately $4.0 \times 10^{17}$ cm$^{-3}$, which is the same as the concentration of the drift region 2.

Figure 4:
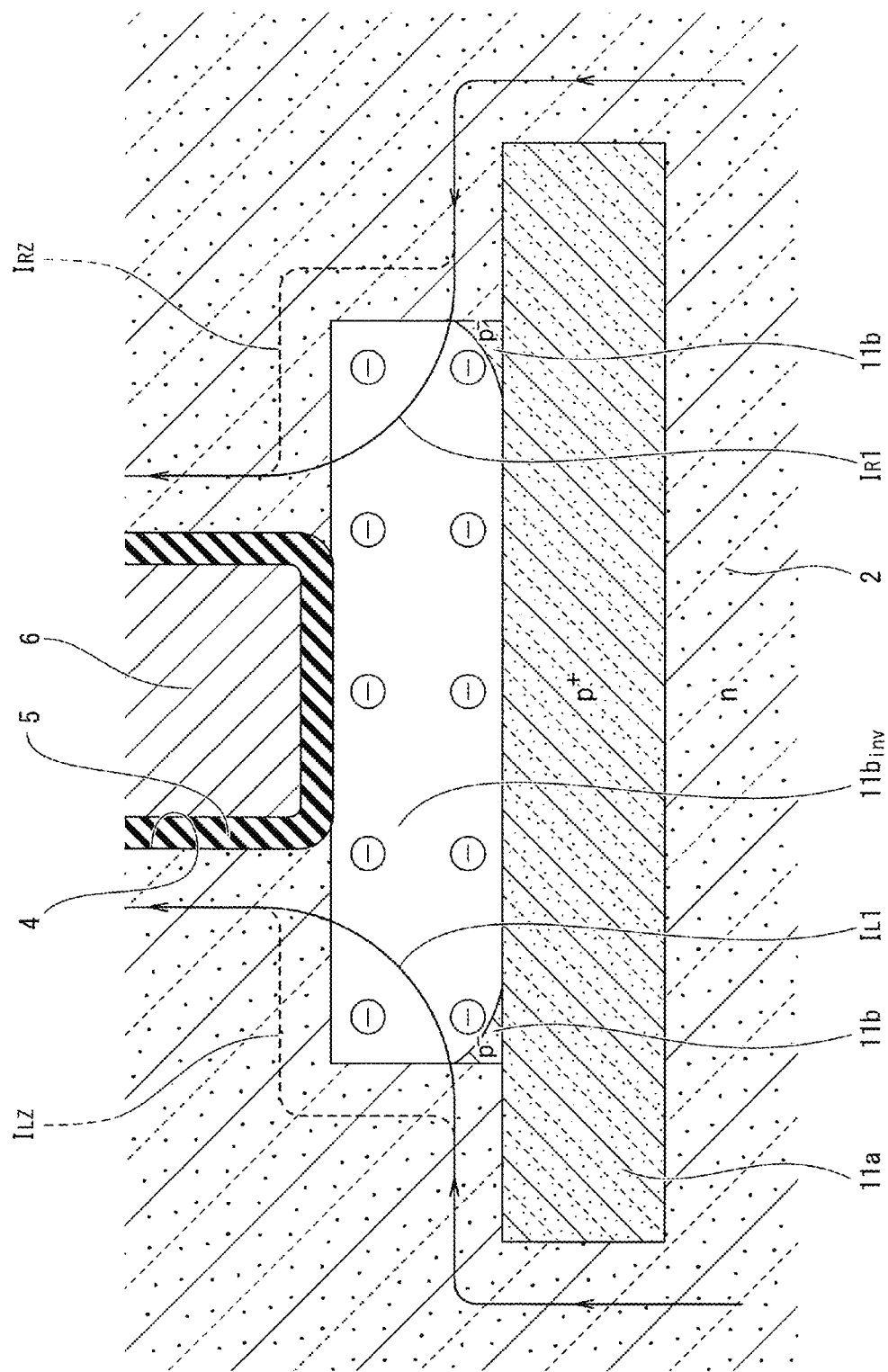
FIG. 4 is a partially enlarged cross-sectional view that schematically describes the respective general states of the main currents flowing in the semiconductor device in the embodiment of the present invention and the semiconductor device in the comparative example.

FIG. 4 schematically shows an overlap between the flow of the main currents $I_L1$, $I_R1$ in the semiconductor device of the embodiment in the present invention shown in FIG. 2 and the flow of the main currents $I_LZ$, $I_RZ$ in the semiconductor device of the comparative example shown in FIG. 3. In FIG. 4, the main currents $I_L1$, $I_R1$ in the semiconductor device of the embodiment in the present invention, which are illustratively shown by the solid lines, enter to inside of the inversion layer $11b_{inv}$ from the lateral end surfaces thereof, and thereafter approach the side walls of the trench 4 while smoothly curving.

On the other hand, in the case of the comparative example, which is illustratively shown by the dashed lines, the main currents $I_LZ$, $I_RZ$ cannot pass through the inside of the protective layer 11z in the paths from the top side of the protective layer 11z to the side walls of the trench 4. Thus, the main currents $I_LZ$, $I_RZ$ must progress along the step-like shape of the outer edges of the protective layer 11z through paths that are longer and much more bent than the paths in the embodiment of the present invention. In the semiconductor device of the embodiment in the present invention, the total path length of the main currents $I_L1$, $I_R1$ can be shortened more than in the comparative example; thus, ON-resistance can be reduced in proportion to the amount shortened.

Figure 5:
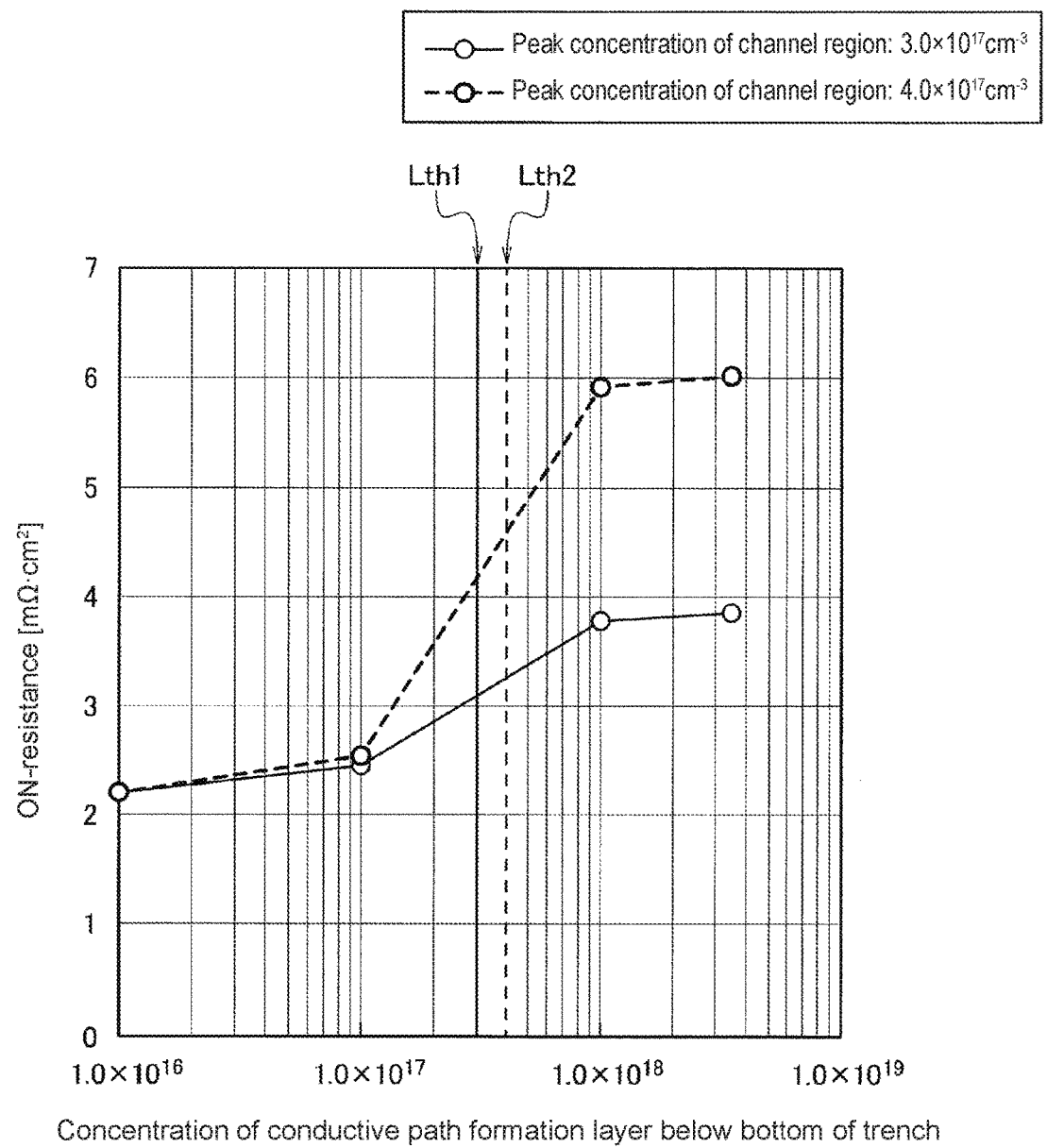
FIG. 5 is a graph showing the relationship between the concentration of a conductive path formation layer below the bottom of a trench and ON-resistance of the semiconductor device.

FIG. 5 shows the relationship between the impurity element concentration of the conductive path formation layer 11b of the protective conduction region (11a, 11b) and the ON-resistance Ron of the semiconductor device. It can be understood that, as the impurity element concentration of the conductive path formation layer 11b lowers, the ON-resistance Ron decreases. The solid vertical line $L_{th}1$ in FIG. 5 visually shows the position where the threshold voltage of the channel regions 3a1, 3b1 exist in a case in which the peak concentration of the channel regions 3a1, 3b1 in the semiconductor device are $3.0 \times 10^{17}$ cm$^3$.

In the range to the left side of the solid vertical line $L_{th}1$ in FIG. 5, the ON-resistance Ron is lower as a whole than in the range to the right side of the vertical line $L_{th}1$, and as the impurity element concentration of the conductive path formation layer 11b decreases, the trajectory of the solid line connecting the plotted points indicated by the white "○"s becomes flatter. Meanwhile, in the range to the right side of the vertical line $L_{th}1$, the ON-resistance Ron is higher as a whole than in the range to the left side of the vertical line $L_{th}1$, and as the impurity element concentration of the conductive path formation layer 11b increases, the trajectory of the solid line connecting the plotted points becomes flatter.

The vertical line $L_{th}2$ of the dashed line in FIG. 5 visually shows the position where the threshold voltage of the channel regions 3a1, 3b1 exists in a case in which the peak concentration of the channel regions 3a1, 3b1 in the semiconductor device is $4.0 \times 10^{17}$ cm$^{-3}$. In the range to the left side of the vertical line $L_{th}2$, the ON-resistance Ron is lower as a whole than for the range to the right side of the vertical line $L_{th}2$, which is similar to the case in which peak concentration of the channel regions 3a1, 3b1 is $3.0 \times 1.0^{17}$ cm$^{-3}$. As the impurity element concentration of the conductive path formation layer 11b decreases, the trajectory of the solid line connecting the plotted points shown by the white "○"s becomes flatter. Meanwhile, in the range to the right side of the vertical line $L_{th}2$, the ON-resistance Ron is higher as a whole than in the range to the left side of the vertical line $L_{th}2$, and as the impurity element concentration of the conductive path formation layer 11b increases, the trajectory of the dashed line connecting the plotted points becomes flatter.

In the semiconductor device of the embodiment in the present invention, the conductive path formation layer 11b where the inversion layer is formed during ON are disposed over the protective layer 11a that protects the gate insulating film 5 at the bottom of the trench 4. Therefore, the paths of the main currents $I_L1$, $I_R1$ flowing during ON is guided to the inversion layer $11b_{inv}$, thereby making it possible to shorten the current paths of the main currents $I_L1$, $I_R1$ more than in the case of a semiconductor device with only the protective layer. Accordingly, it is possible to provide a semiconductor device that can both protect the gate insulating film 5 at the bottom of the trench 4 and can reduce ON-resistance.

<Method of Manufacturing Semiconductor Device>

Figure 6:
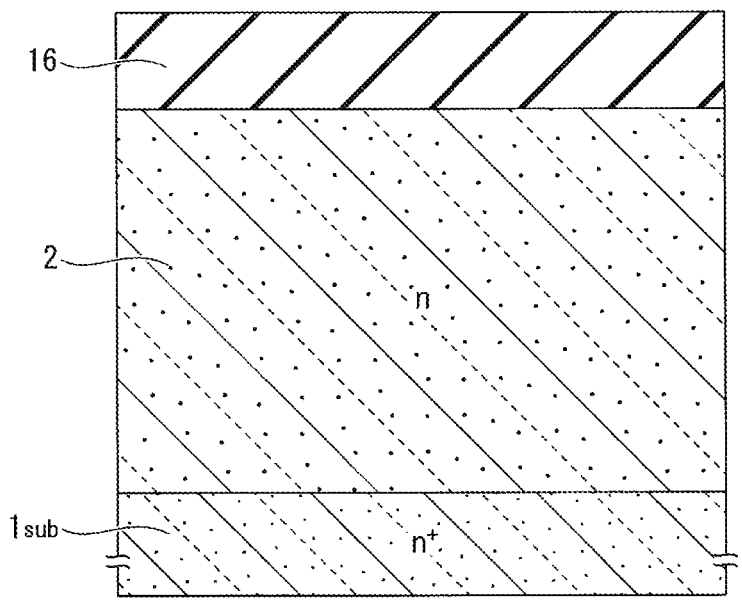
FIG. 6 is a first cross-sectional view that schematically describes a method of manufacturing the semiconductor device in the embodiment of the present invention.

Next, a method of manufacturing the semiconductor device of one embodiment in the present invention will be illustratively described with reference to FIGS. 6 to 14. First, as shown in FIG. 6, an n$^+$-type 4H-SiC semiconductor substrate $1_{sub}$ is prepared, and then an epitaxial growth method is used to epitaxially grow an n-type 4H-SiC semiconductor layer on the semiconductor substrate $1_{sub}$, thus forming the drift region 2, for example. Next, a first mask film 16 is deposited on the top surface of the drift region 2 at a prescribed thickness. For the first mask film 16, it is possible to use a silicon oxide ($SiO_2$), a silicon nitride ($Si_3N_4$) film, or the like that is formed by a thermal oxidation treatment or deposition via chemical vapor deposition (CVD), or the like.

Figure 7:
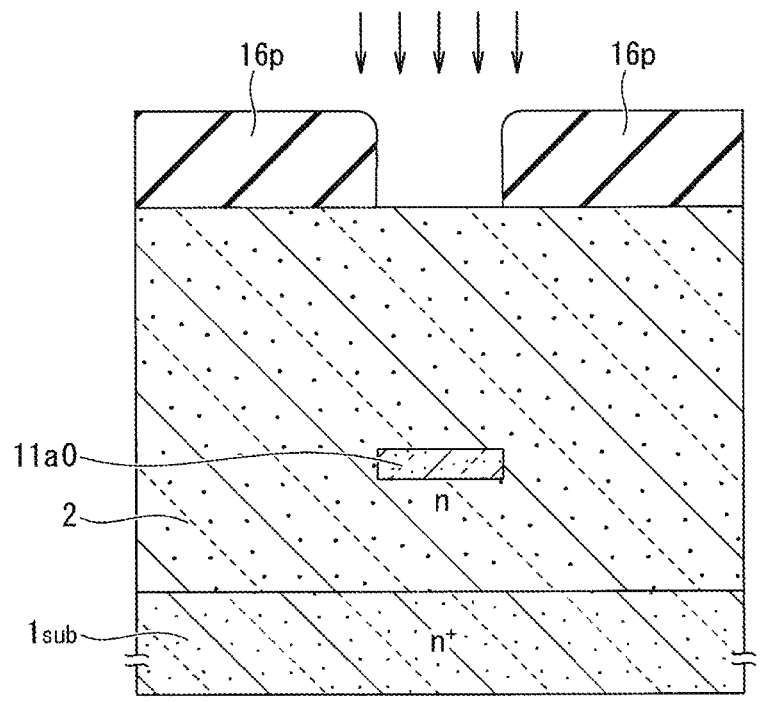
FIG. 7 is a second cross-sectional view that schematically describes the method of manufacturing the semiconductor device in the embodiment of the present invention.

Next, photolithography and etching etc. are used to coat a photoresist film on the first mask film 16 and then pattern the photoresist film. As shown in FIG. 7, the patterned photoresist film is used as a mask while a portion of the first mask film 16 positioned on an area where the trench 4 is to be formed is selectively removed to form a window. The forming of the window can be done by an etching technique such as reactive ion etching (RIE).

After removal of the photoresist film, a first mask 16p having the window is used as an ion implantation mask, and impurity element ions such as Al, are implanted inside of the drift region 2 via multiple-stage ion implantation or the like, thus forming an area 11a0 that will become a protective layer later. The photoresist film used during etching of the first mask film 16 may be left without being removed from the top of the drift region 2, and may be used as an ion implantation mask along with the first mask 16p.

Figure 8:
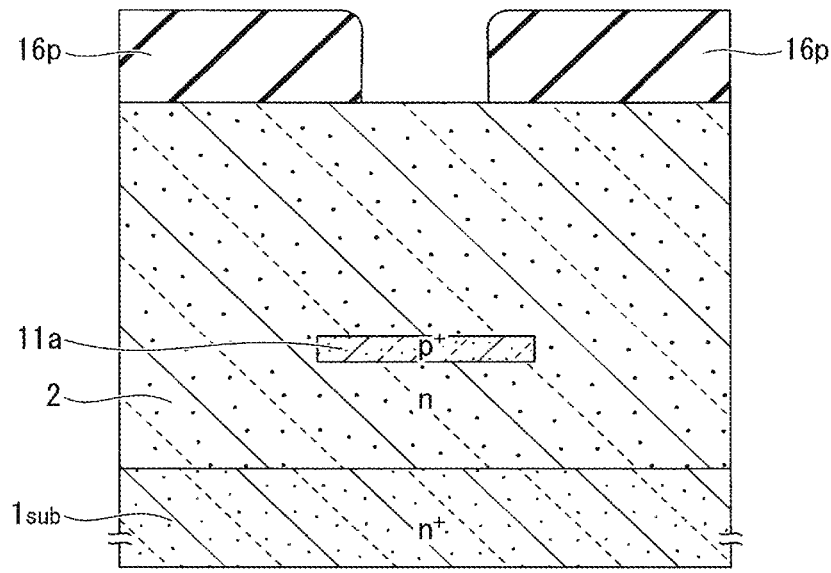
FIG. 8 is a third cross-sectional view that schematically describes the method of manufacturing the semiconductor device in the embodiment of the present invention.

Next, as shown in FIG. 8, vacuum annealing or the like is performed on the structure (hereinafter, simply "semiconductor substrate $1_{sub}$") having the semiconductor substrate $1_{sub}$ at the bottom thereof in order to activate the area 11a0 that will become a protective layer and to form the p$^+$-type protective layer 11a, which serves as the first layer of the protective conduction region. The protective layer 11a is formed such that both ends thereof will each protrude by a fixed width w outside of the trench width of the trench 4, which is formed later.

Figure 9:
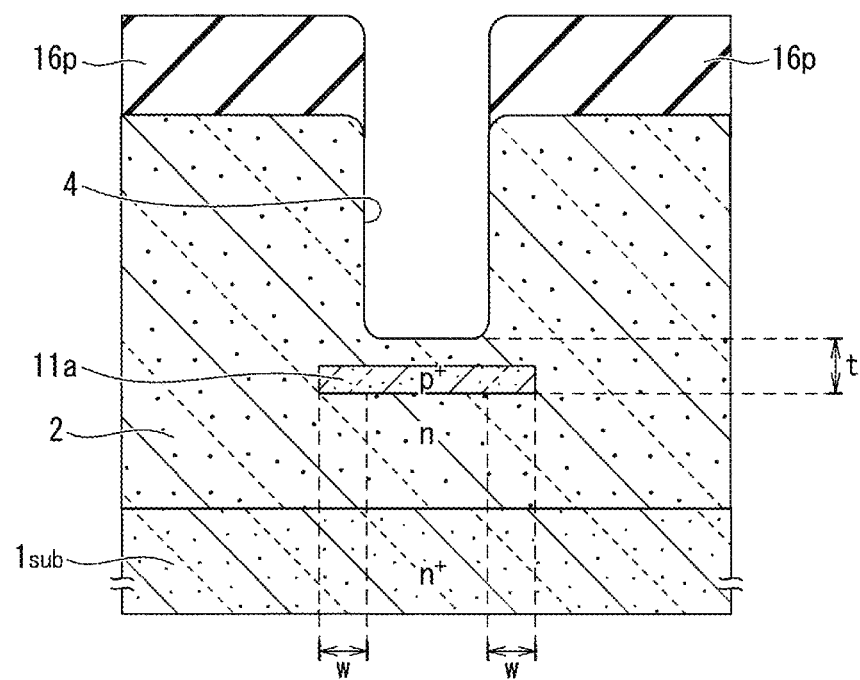
FIG. 9 is a fourth cross-sectional view that schematically describes the method of manufacturing the semiconductor device in the embodiment of the present invention.

Next, as shown in FIG. 9, the drift region 2 is dug out via etching such as RIE while continuously using the first mask 16p having the window, thus forming the trench 4. The position of the trench 4 is controlled such that the gap between the position of the bottom of the trench and the position of the bottom surface of the protective layer 11a is equal to the thickness t of the protective conduction region (11a, 11b), which will be formed later.

Figure 10:
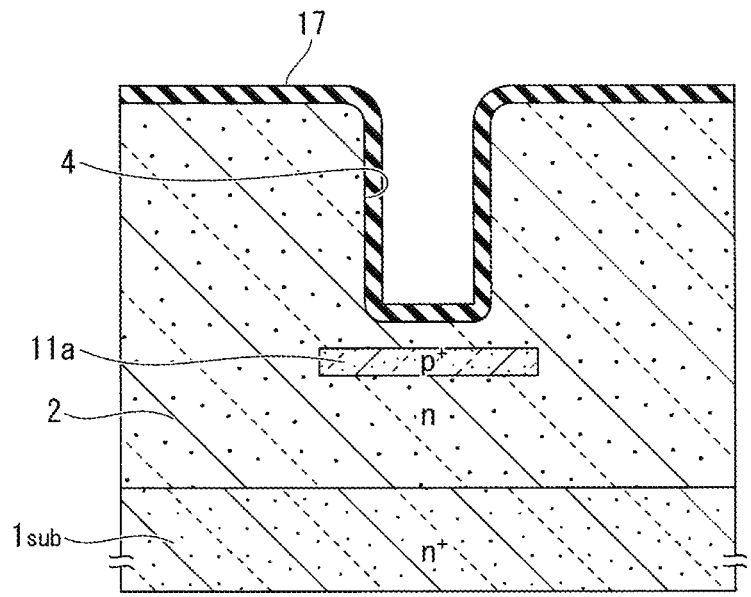
FIG. 10 is a fifth cross-sectional view that schematically describes the method of manufacturing the semiconductor device in the embodiment of the present invention.

Next, the semiconductor substrate $1_{sub}$ is cleaned and the first mask 16p is removed, and thereafter, as shown in FIG. 10, a second mask film 17 is deposited at a prescribed thickness on the top surface of the exposed drift region 2. The second mask film 17 can be a protective film such as a $SiO_2$ film deposited by plasma-enhanced CVD or the like, for example.

Figure 11:
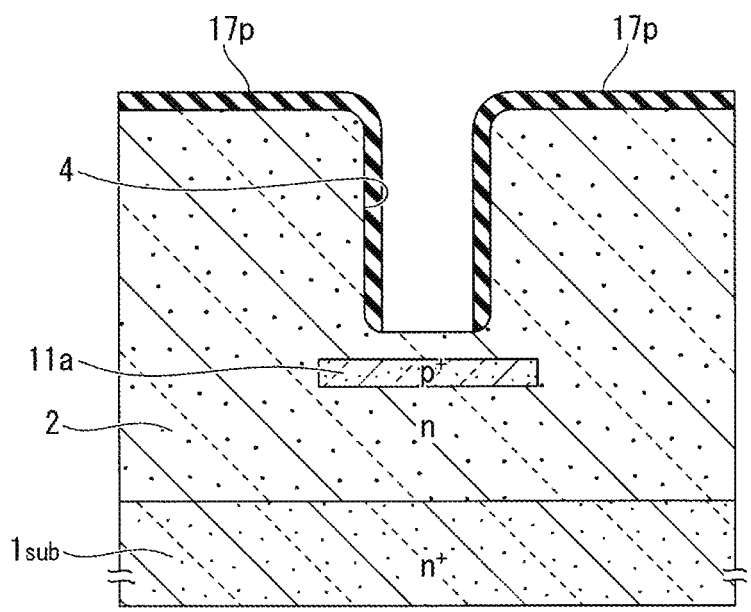
FIG. 11 is a sixth cross-sectional view that schematically describes the method of manufacturing the semiconductor device in the embodiment of the present invention.

Next, photolithography and etching etc. are used to coat a photoresist film on the second mask film 17 and then pattern the photoresist film. Then, while using the patterned photoresist film as a mask, the portion of the second mask film 17 positioned on the trench 4 is selectively removed via RIE or the like to form a window, and as shown in FIG. 11, the bottom of the trench 4 is exposed. At such time, the dimensions of the opening of the window are adjusted such that side wall portions of the second mask film 17 in the trench 4 remain.

Figure 12:
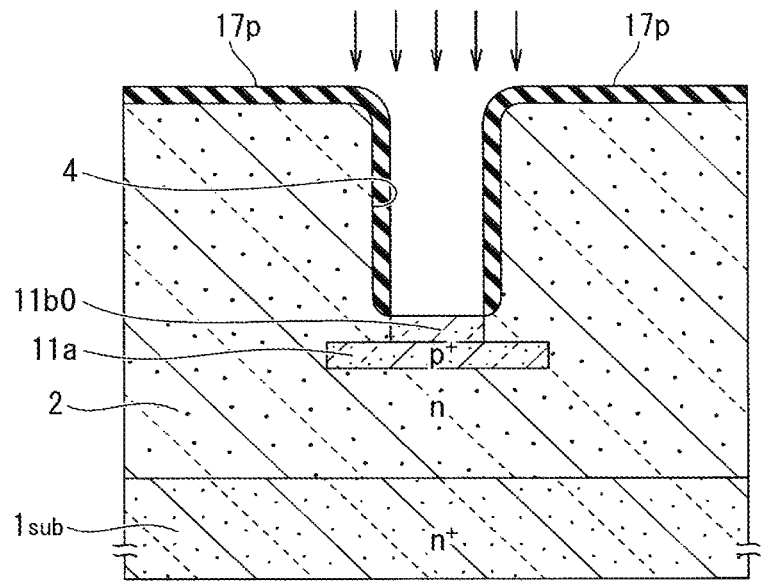
FIG. 12 is a seventh cross-sectional view that schematically describes the method of manufacturing the semiconductor device in the embodiment of the present invention.

Thereafter, as shown in FIG. 12, ion implantation is performed via a second mask 17p in which a window is formed, thereby forming an area 11b0 that will become a conductive path formation layer later inside the drift region 2 between the protective layer 11a and the bottom of the trench 4. Ion implantation is performed while controlling the implantation depth of the p-type impurity element ions such as Al. During ion implantation, the side wall portions of the trench 4 are protected by the second mask 17p.

Figure 13:
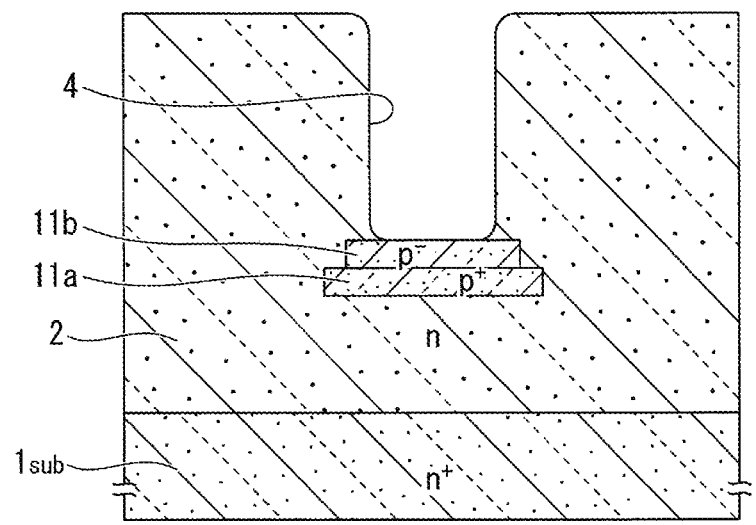
FIG. 13 is an eighth cross-sectional view that schematically describes the method of manufacturing the semiconductor device in the embodiment of the present invention.

Next, vacuum annealing or the like is performed on the semiconductor substrate $1_{sub}$ to activate the area 11b0 that will become a conductive path formation layer. Due to the activation, the conductive path formation layer 11b, which will serve as the second layer of the protective conduction region (11a, 11b), is formed so as to have a protrusion width intended to shorten the path lengths of the main currents. Then, by full surface etching or the like, the second mask 17p remaining on the structure is removed, and as shown in FIG. 13, this exposes the top surface of the drift region 2 and the side walls of the trench 4, and a cleaning treatment or the like is performed on the semiconductor substrate $1_{sub}$.

Figure 14:
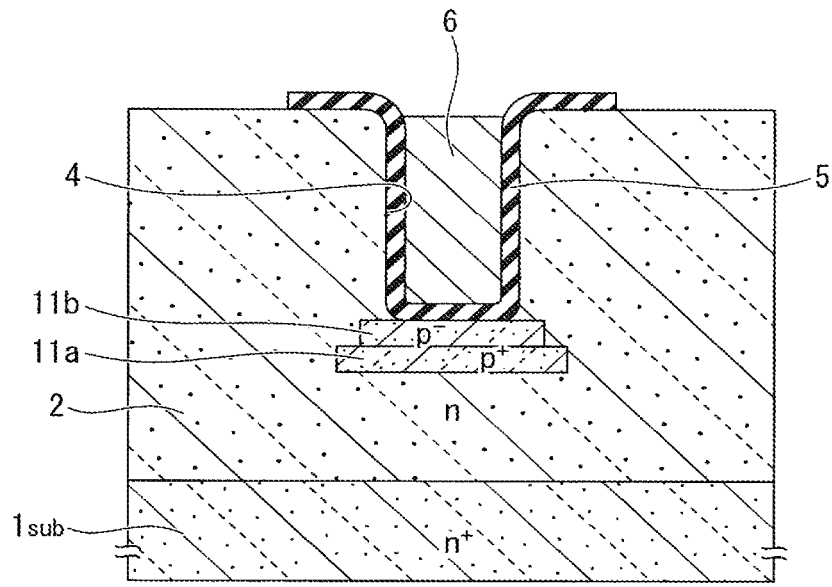
FIG. 14 is a ninth cross-sectional view that schematically describes the method of manufacturing the semiconductor device in the embodiment of the present invention.

Next, as shown in FIG. 14, a thermal oxidation treatment or the like is used to deposit an insulating film such as a $SiO_2$ film on the front surface of the drift region 2 including the insides of the trench 4. The deposited insulating film is patterned via photolithography, dry etching etc. to form the gate insulating film 5. Then, a doped polysilicon film or the like to which n-type impurity elements have been added is deposited on the entire top surface of the drift region 2 by low pressure CVD or the like. Thereafter, a treatment such as etch-back or chemical machine polishing (CMP) is used to embed the doped polysilicon film inside the trench 4 and form the gate electrode 6.

After this, photolithography, etching, ion implantation, etc. are used to provide the first below-contact base regions 13a, 13b and the second below-contact base regions 14a, 14b, in the stated order in respectively prescribed patterns, in the area between the trenches 4 inside the drift region 2. Next, the base regions 3a, 3b are similarly provided in the area between the trenches 4 inside the drift region 2. If the base regions 3a, 3b are formed via the implantation of p-type impurity element ions such as Al, then ion implantation is formed such that the peak dosage amount of the implantation ions is higher than the dosage amount of the impurity element ions during forming of the conductive path formation layer 11b.

In other words, in the method of manufacturing the semiconductor device of the embodiment in the present invention, the dosage amount of ions when forming the conductive path formation layer 11b is lower than the peak dosage amount of ions when forming the base regions 3a, 3b. By controlling each dosage amount, as shown in FIG. 5, the concentration of the impurity element during forming of the conductive path formation layer 11b is lower than the peak concentration of the impurity element of the channel regions 3a1, 3b1.

Thereafter, photolithography, etching, ion implantation, and the like are used to provide the base contact regions 12a, 12b and source regions 7a, 7b in prescribed patterns inside the base regions 3a, 3b. Then, CVD or the like is used to deposit an interlayer insulating film 8 such as a $SiO_2$ film across the top of the gate electrode 6, base contact regions 12a, 12b, and source regions 7a, 7b. The bottom surface of the semiconductor substrate $1_{sub}$ is thinned and planarized via CMP or the like to form the drain region 1. A metal film such as nickel (Ni) is formed below the drain region 1, and the formed metal film is patterned to form the drain electrode 10.

After a prescribed annealing or the like has been performed as necessary, a barrier metal layer 15 made of three laminated metal layers such as a Ti layer, TiN layer, and Ti layer is formed via vacuum vapor deposition, sputtering, CVD, or the like, for example. The barrier metal layer 15 is disposed across the top of the interlayer insulating film 8, source regions 7a, 7b, and base contact regions 12a, 12b.

An alloy film, or the like, containing Al as a main element, for example, is deposited on the barrier metal layer 15, and photolithography and etching etc. are used to pattern the film into a prescribed shape and form the source electrode 9. Thereafter, a sintering treatment via annealing or the like is performed. The series of steps described above make it possible to obtain the semiconductor device of the embodiment in the present invention.

In the method of manufacturing the semiconductor device of the embodiment in the present invention, providing the protective layer 11a and the conductive path formation layer 11b makes it possible to manufacture a semiconductor device that can both protect the gate insulating film 5 at the bottom of the trench 4 and that can reduce ON-resistance.

Furthermore, in the method of manufacturing the semiconductor device of the embodiment in the present invention, the protective layer 11a is formed longer than the width of the trench 4 such that both ends of the protective layer each protrude further outside the trench 4 by a fixed width w. It is also possible for the length of the protective layer 11a to match the length of the trench 4. However, in a manufacturing worksite of semiconductors where photolithography is often used, if the width of the protective layer 11a is set to the same value as the width of the trench 4, it may not possible to avoid transfer deviations arising from limits of current positioning precision. If a transfer deviation causes a non-overlapping portion of the protective layer 11a and trench 4 to be formed, it may not be possible to sufficiently protect the gate insulating film 5. In the semiconductor device of the embodiment in the present invention, ensuring that the width of the protective layer 11a is intentionally and sufficiently longer than the width of the trench 4 guarantees that the gate insulating film 5 at the bottom of the trench 4 will be reliably protected, even if transfer deviation occurs.

Furthermore, in the method of manufacturing the semiconductor device of the embodiment in the present invention, the trench 4 is dug out first, and ion is implanted via the space inside the dugout trench 4 in order to form the conductive path formation layer 11b. This makes it possible for the ion implantation to be shallow, simple, and to suppress a large increase in processing energy. The conductive path formation layer 11b is formed shallow directly below the trench 4 such that the top surface of the conductive path formation layer 11b contacts the bottom surface of the gate insulating film 5, thus making it possible to perform ion implantation with even more ease.

Moreover, in the method of manufacturing the semiconductor device of the embodiment in the present invention, each ion implantation is controlled such that the dosage amount of the impurity element ions during forming of the conductive path formation layer 11b is lower than the peak dosage amount of the impurity element ions during forming of the base regions 3a, 3b. Because it is possible to use ion implantation equipment that is already widely being used as manufacturing equipment as-is, it is possible to manufacture the semiconductor device of the embodiment in the present invention while suppressing the burden of new capital investment.

In the method of manufacturing the semiconductor device in the embodiment of the present invention, the same first mask 16p is used in both the process of digging out the trench 4 and the ion implantation process for forming the protective layer 11a. It is unnecessary to replace the mask during the two processes, which makes it possible to simplify the manufacturing process and alleviate burdens.

In the method of manufacturing the semiconductor device of the embodiment in the present invention, the protective layer 11a and conductive path formation layer 11b are formed while controlling the concentration, thickness t, etc. thereof separately from the first below-contact base regions 13a, 13b positioned at the same depth as the protective conductive region (11a, 11b). Therefore, it is possible to further enhance the precision of the concentration of the respective impurity elements of the protective layer 11a and conductive path formation layer 11b, the thickness, etc.

In the manufacturing method of the semiconductor device of the embodiment in the present invention, the side wall portions of the trench 4 are protected by the second mask 17p during ion implantation for the conductive path formation layer 11a. Thus, it is possible to prevent a degradation in quality of the channel regions 3a1, 3b1 of the base regions 3a, 3b corresponding to the side walls of the trench 4.

First Modification Example

Next, a method of manufacturing a semiconductor device of a first modification example of the embodiment in the present invention will be described with reference to FIGS. 15 to 18. An $n^+$-type 4H-SiC semiconductor substrate $1_{sub}$ is prepared, and an epitaxial growth method is used to epitaxially grow an n-type 4H-SiC semiconductor layer on the semiconductor substrate $1_{sub}$, thus forming a drift region 2, for example. Next, a first mask film 16 is deposited on the top surface of the drift region 2 at a prescribed thickness. The first mask film 16 can be a $SiO_2$ film, a $Si_3N_4$ film, or the like that is formed by a thermal oxidation treatment or deposition via CVD, or the like. The steps up until here are the same as those described using FIG. 6 above.

Figure 15:
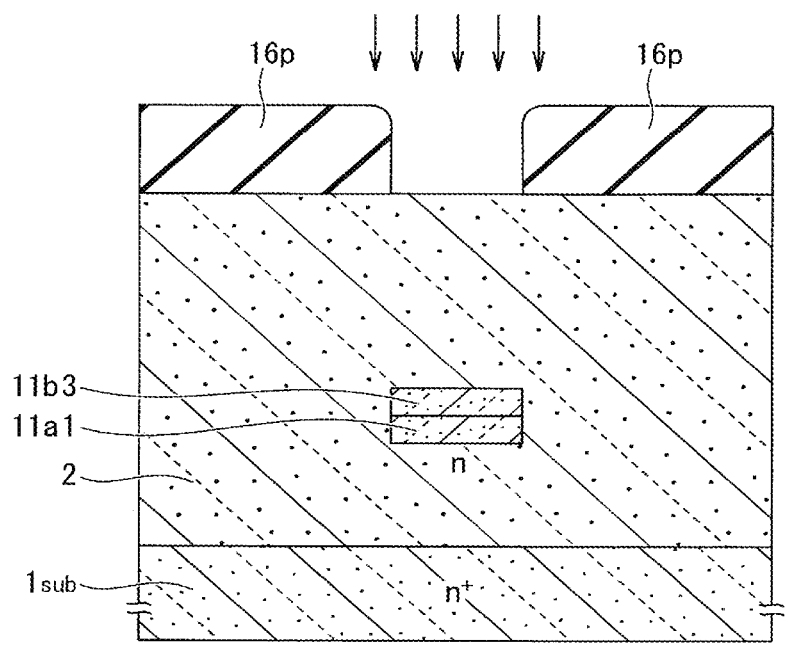
FIG. 15 is a first cross-sectional view that schematically describes a method of manufacturing a semiconductor device in a first modification example of the embodiment in the present invention.

Next, photolithography, etching, etc. are used to coat a photoresist film on the first mask film 16 and pattern the photoresist film. As shown in FIG. 15, while using the patterned photoresist film as a mask, the portion of the first mask film 16 positioned over the area where the trench 4 is to be formed is selectively removed to form a window. The formation of the window can be performed via an etching technique such as RIE.

After removal of the photoresist film, a first mask 16p having the window is used as an ion implantation mask while impurity element ions such as Al, for example, are implanted inside of the drift region 2 via multiple-stage ion implantation or the like. Due to the implantation, an area 11a1 that will become a protective layer later and an area 11b3 that will become a conductive path formation layer later are respectively formed with the heights thereof changed so as to have the same impurity element concentration. The photoresist film used during etching of the first mask film 16 may be left without being removed from the top of the drift region 2, and may be used as an ion implantation mask along with the first mask 16p.

Figure 16:
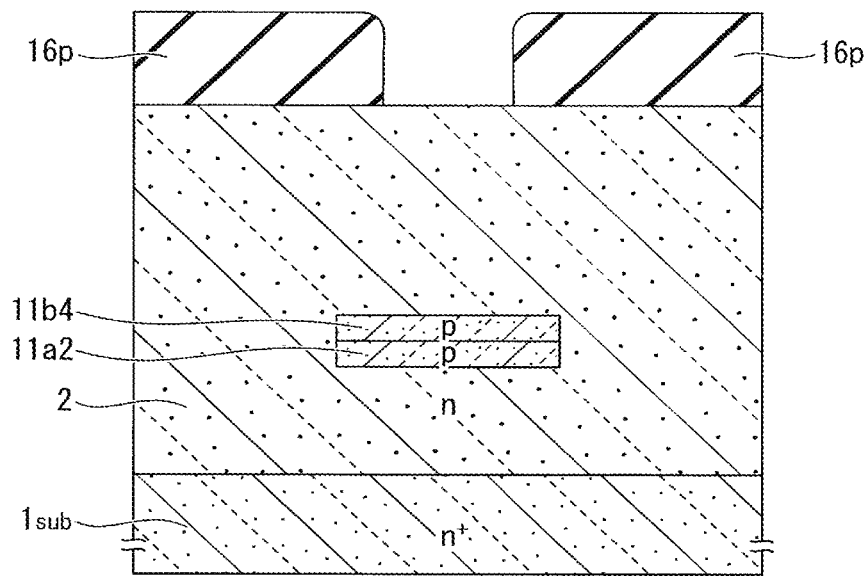
FIG. 16 is a second cross-sectional view that schematically describes the method of manufacturing the semiconductor device in the first modification example of the embodiment in the present invention.

Next, as shown in FIG. 16, vacuum annealing or the like is performed on the semiconductor substrate $1_{sub}$ in order to activate the area 11a1 that will become a protective layer and the area 11b3 that will become a conductive path formation layer, thus forming a p-type protective layer 11a2 and a conductive path formation layer 11b4, which will serve as the protective conduction region. Both the protective layer 11a2 and conductive path formation layer 11b4 are formed such that both ends thereof each protrude by a fixed width w outside the trench width of the trench 4, which is formed later.

Figure 17:
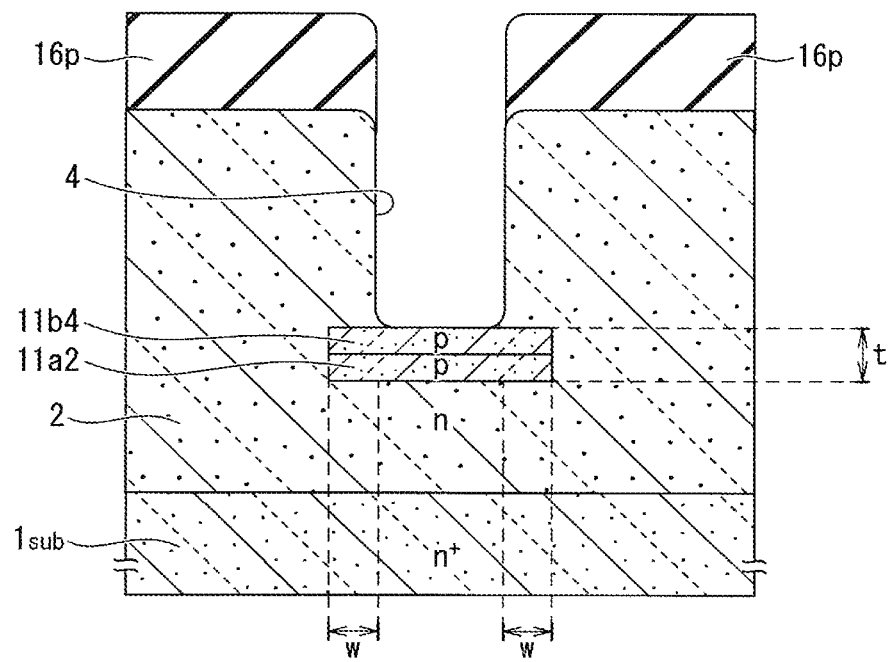
FIG. 17 is a third cross-sectional view that schematically describes the method of manufacturing the semiconductor device in the first modification example of the embodiment in the present invention.

Next, as shown in FIG. 17, etching such as RIE is used to dig out the drift region 2 and form the trench 4 while continuously using the first mask 16p having the window. The position of the trench 4 is controlled such that the gap between the position of the bottom of the trench and the position of the bottom surface of the protective layer 11a2 is a prescribed width t.

Figure 18:
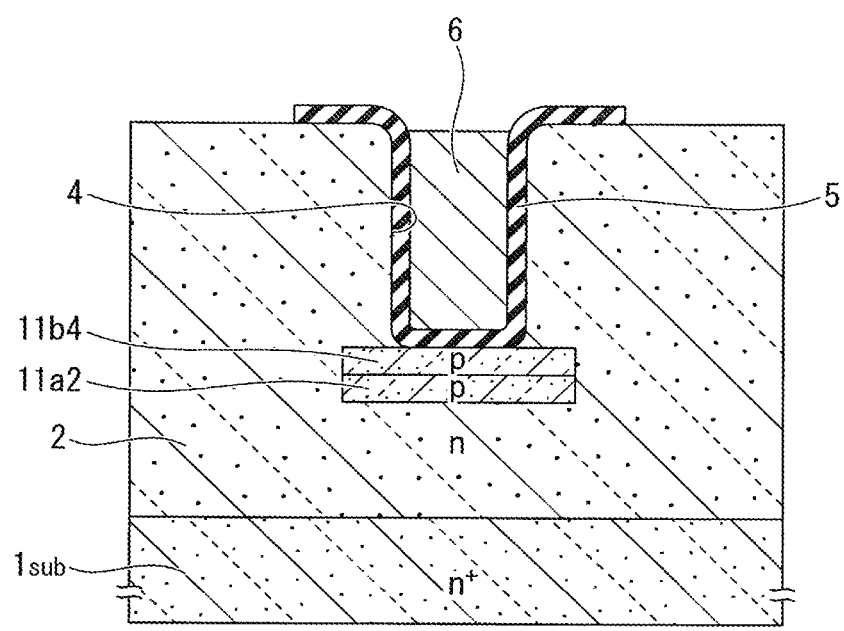
FIG. 18 is a fourth cross-sectional view that schematically describes the method of manufacturing the semiconductor device in the first modification example of the embodiment in the present invention.
Figure 19:
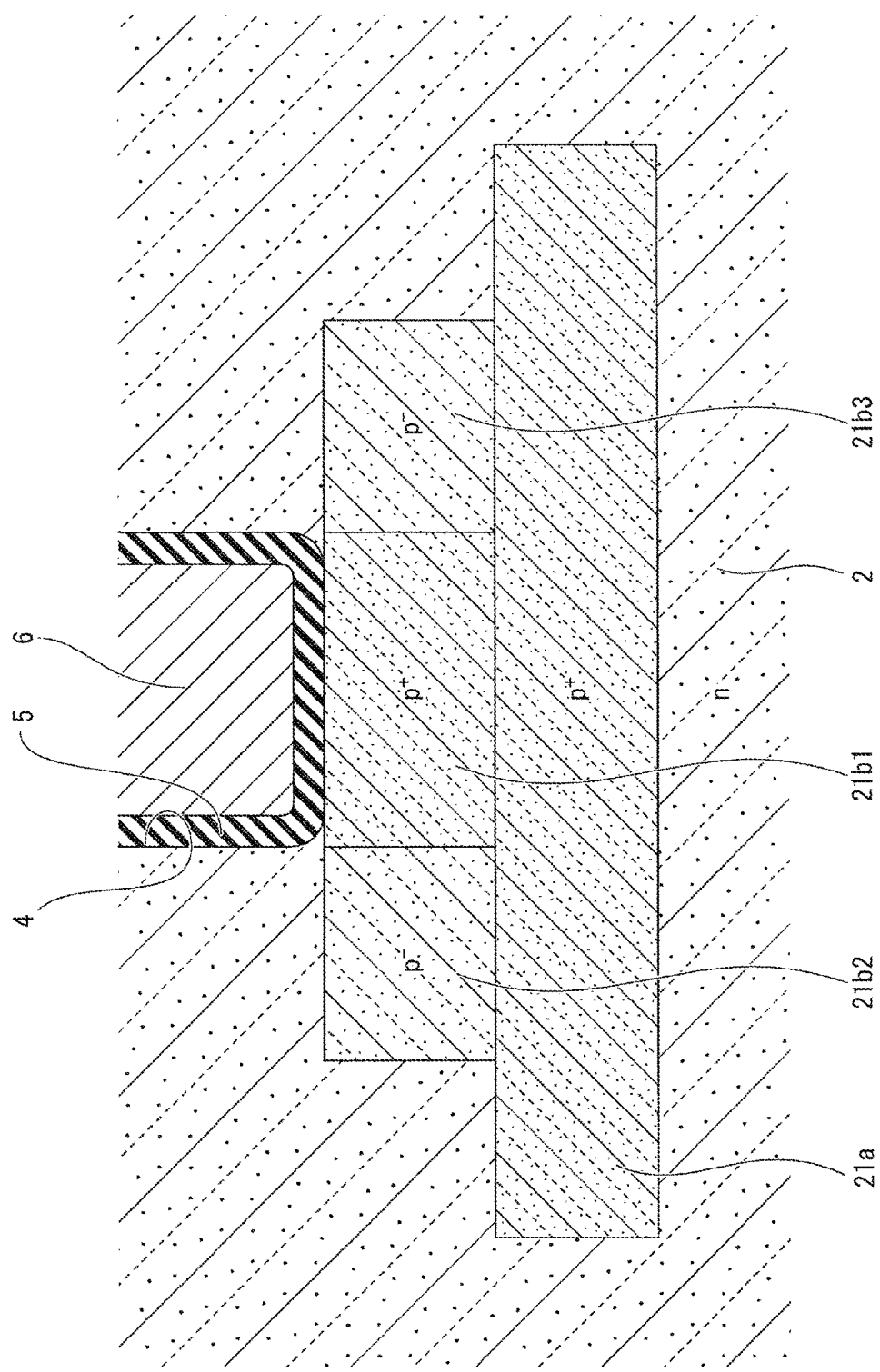
FIG. 19 is an enlarged partial cross-sectional view that schematically describes a general configuration of a semiconductor device of a second modification example of the embodiment in the present invention.

Next, the semiconductor substrate $1_{sub}$ is cleaned, the first mask 16p is removed, and thereafter, as shown in FIG. 18, a thermal oxidation treatment or the like is used to deposit an insulating film such as a $SiO_2$ film on the surface of the drift region 2 including the insides of the trench 4. The deposited insulating film is patterned via photolithography, dry etching, and the like to form the gate insulating film 5. Then, a doped polysilicon film or the like to which n-type impurity elements have been added is deposited on the entire top surface of the drift region 2 by low pressure CVD or the like. Thereafter, a treatment such as etch-back or chemical machine polishing (CMP) is used to embed the doped polysilicon film inside the trench 4 and form the gate electrode 6.

After this, photolithography, etching, ion implantation, etc. are used to provide, in respectively prescribed patterns, the first below-contact base regions 13a, 13b and the second below-contact base regions 14a, 14b in the stated order in the area between the trenches 4 inside the drift region 2. Next, the base regions 3a, 3b are similarly provided in the area between the trenches 4 inside the drift region 2. If the base regions 3a, 3b are formed via the implantation of p-type impurity element ions such as Al, then ion implantation is formed such that the peak dosage amount of the implantation ions is higher than the dosage amount of the impurity element ions during forming of the conductive path formation layer 11b.

In other words, in the method of manufacturing the semiconductor device in the first modification example of the embodiment in the present invention, the dosage amount of ions during forming of the conductive path formation layer 11b4 and protective layer 11a2 is lower than the peak dosage amount of ions during forming of the base regions 3a, 3b. By controlling each dosage amount, the concentration of the impurity element when forming the conductive path formation layer 11b4 is lower than the peak concentration of the impurity element of the channel regions 3a1, 3b1.

Thereafter, photolithography, etching, ion implantation, and the like are used to provide the base contact regions 12a, 12b and source regions 7a, 7b in prescribed patterns inside the base regions 3a, 3b. Then, CVD or the like is used to deposit an interlayer insulating film 8 such as a $SiO_2$ film across the top of the gate electrode 6, base contact regions 12a, 12b, and source regions 7a, 7b. The bottom surface of the semiconductor substrate $1_{sub}$ is thinned and planarized via CMP or the like to form the drain region 1. A metal film such as Ni is formed below the drain region 1, and the formed metal film is patterned to form the drain electrode 10.

After a prescribed annealing or the like has been performed as necessary, a barrier metal layer 15 made of three laminated metal layers such as a Ti layer, TiN layer, and Ti layer is formed via vacuum vapor deposition, sputtering, CVD, or the like, for example. The barrier metal layer 15 is disposed across the top of the interlayer insulating film 8, source regions 7a, 7b, and base contact regions 12a, 12b. A nickel silicide layer (not shown) is provided between the source regions 7a, 7b, base contact regions 12a, 12b, and barrier metal layer 15.

An alloy film or the like containing Al as a main element, for example, is deposited on the barrier metal layer 15, and photolithography, etching, etc. are used to pattern the film into a prescribed shape and form the source electrode 9. Thereafter, a sintering treatment via annealing or the like is performed. The series of steps described above make it possible to obtain the semiconductor device of the embodiment in the present invention.

In the method of manufacturing the semiconductor device in the first modification example of the embodiment in the present invention, providing the protective layer 11a2 and the conductive path formation layer 11b4 makes it possible to manufacture a semiconductor device that can both protect the gate insulating film 5 at the bottom of the trench 4 and reduce ON-resistance. The concentration of the impurity element in the protective layer 11a2 and conductive path formation layer 11b4 is the same, but by lowering the concentration below that of the base regions 3a, 3b, for example, it is possible to invert the conductive path formation layer 11b4 at the bottom of the trench 4 during ON.

Furthermore, in the semiconductor device of the first modification example in the embodiment of the present invention, the protective layer 11a2 and conductive path formation layer 11b4 can be formed with the same mask, and thus transfer deviation does not occur.

Second Modification Example

Next, a semiconductor device of a second modification example of the embodiment in the present invention will be described with reference to FIGS. 19 to 26. As in the semiconductor device of the second modification example shown in FIG. 19, the impurity element concentration inside a p-type conductive path formation layer (21b1 to 21b3) of which the top surface contacts the bottom of the trench 4 may be differed along the width direction of the trench 4 for each region. A protective conductive region (21a, 21b1 to 21b3) in the semiconductor device of the second modification example is a two-layer structure made of the protective layer 21a and a conductive path formation layer (21b1 to 21b3).

The conductive path formation layer (21b1 to 21b3) in the semiconductor device of the second modification example has a high-concentration p$^+$-type center protective region 21b1 disposed in the center. Both the left and right sides of the center protective region 21b1 have provided thereon a low-concentration p$^-$-type left-side conductive path formation region 21b2 and a right-side conductive path formation region 21b3 each at approximately the same thickness.

The center protective region 21b1 is provided directly below the trench 4 and above the protective layer 21a, has approximately the same width as the trench width of the trench 4, and extends along the direction in which the trench 4 extends, which is the direction going through the sheet of paper on which the drawing is depicted. The impurity element concentration of the center protective region 21b1 is configured such that the conductivity type will not invert, but rather remain p-type, even during ON.

The left-side conductive path formation region 21b2 has approximately the same thickness as the center protective region 21b1, and extends along the direction in which the trench 4 extends, similar to the center protective region 21b1. The impurity element concentration of the left-side conductive path formation region 21b2 is set to a low concentration at which the conductivity type inverts to n-type during ON.

The right-side conductive path formation region 21b3 is configured so as to have left-right symmetry with the left-side conductive path formation region 21b2 about the center protective region 21b1. The impurity element concentration of the right-side conductive path formation region 21b3 is set to a low concentration at which the conductivity type inverts to n-type during ON, similar to the left-side conductive path formation region 21b2. Except for the conductive path formation layer (21b1 to 21b3), the structure of the semiconductor device in the second modification example is equivalent to the members of the same name in the semiconductor device in the embodiment of the present invention shown in FIG. 1, and thus redundant explanations will be omitted.

Figure 20:
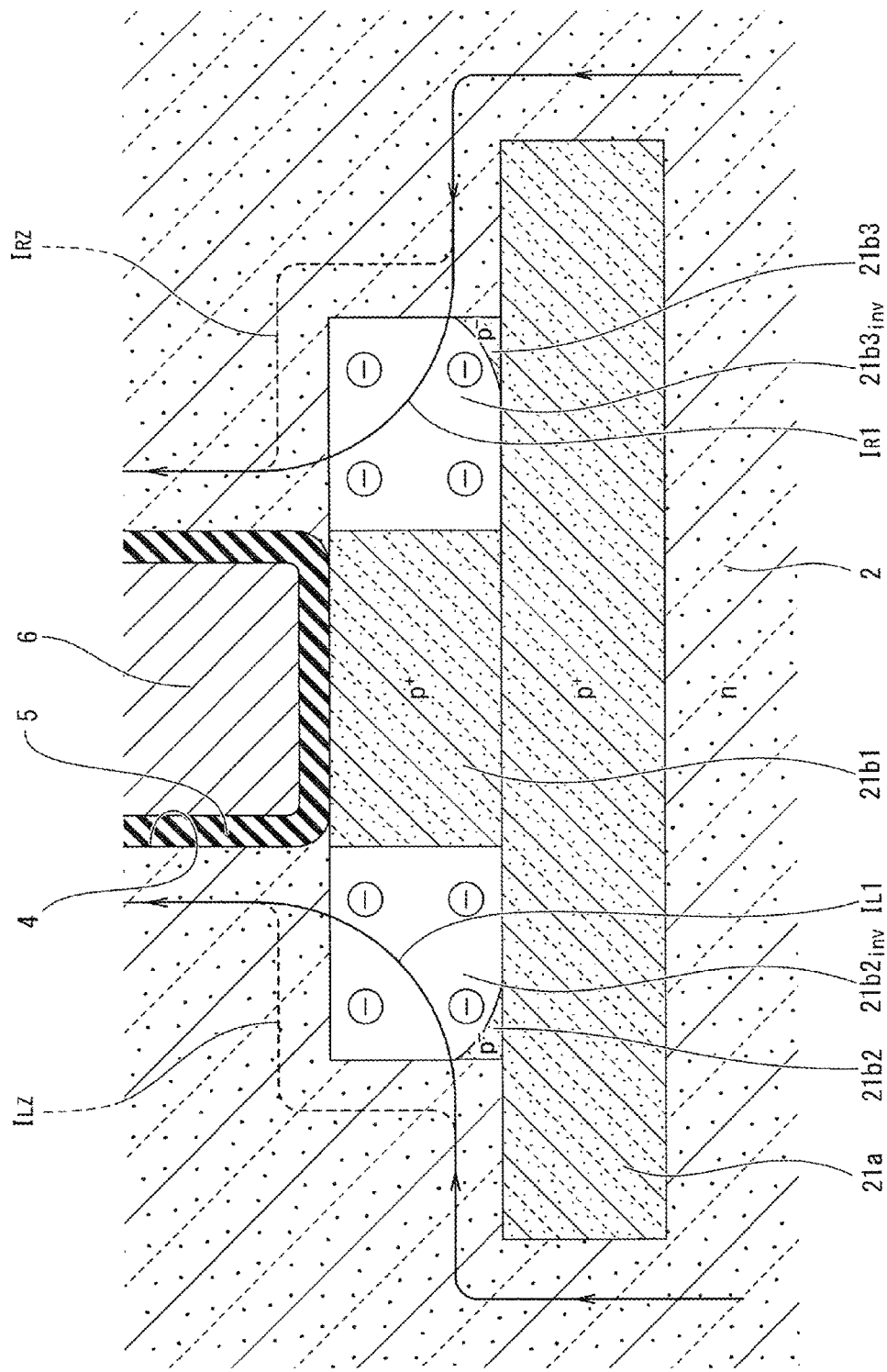
FIG. 20 is an enlarged partial cross-sectional view that schematically describes a general state of main currents flowing to the semiconductor device of the second modification example of the embodiment in the present invention.

As shown in FIG. 20, in the semiconductor device of the second modification example, a gate voltage is applied during ON to form an inversion layer $21b1_{inv}$ in the left-side conductive path formation region 21b2, similar to the channel regions 3a1, 3b1. An inversion layer $21b2_{inv}$ is also formed in the right-side conductive path formation region 21b3. The inversion layer $21b1_{inv}$ and inversion layer $21b2_{inv}$ form paths that conduct main currents $I_L1$, $I_R1$, similar to the inversion layer $11b1_{inv}$ of the conductive path formation layer 11b in the semiconductor device shown in FIG. 1.

Similar to above, in the semiconductor device of the second modification example, the main currents $I_L1$, $I_R1$ flow from the bottom side of the drift region 2 to toward the channel regions 3a1, 3b1. Both ends of the conductive path formation layer (21b1 to 21b3) are formed in a position interfering with the paths of the main currents $I_L1$, $I_R1$ during ON. In the second modification example, the left-side conductive path formation region 21b2 and right-side conductive path formation region 21b3, of which the conductivity type inverts during ON, are provided at both ends of the conductive path formation layer (21b1 to 21b3). Accordingly, the main currents $I_L1$, $I_R1$ are guided toward the side walls of the trench 4 and can pass through shorter paths, thus making it possible to reduce ON-resistance of the semiconductor device.

Furthermore, in the second modification example in which the concentration of the impurity element of the conductive path formation layer (21b1 to 21b3) decreases from the center along the directions toward the outside, it is possible to arrange the high-concentration center protective region 21b1 directly below the bottom of the trench 4. This makes it possible to further improve the protection of the gate insulating film 5 during OFF. The other effects of the semiconductor device of the second modification example are similar to the semiconductor device of the embodiment in the present invention shown in FIG. 1.

Third Modification Example

Figure 21:
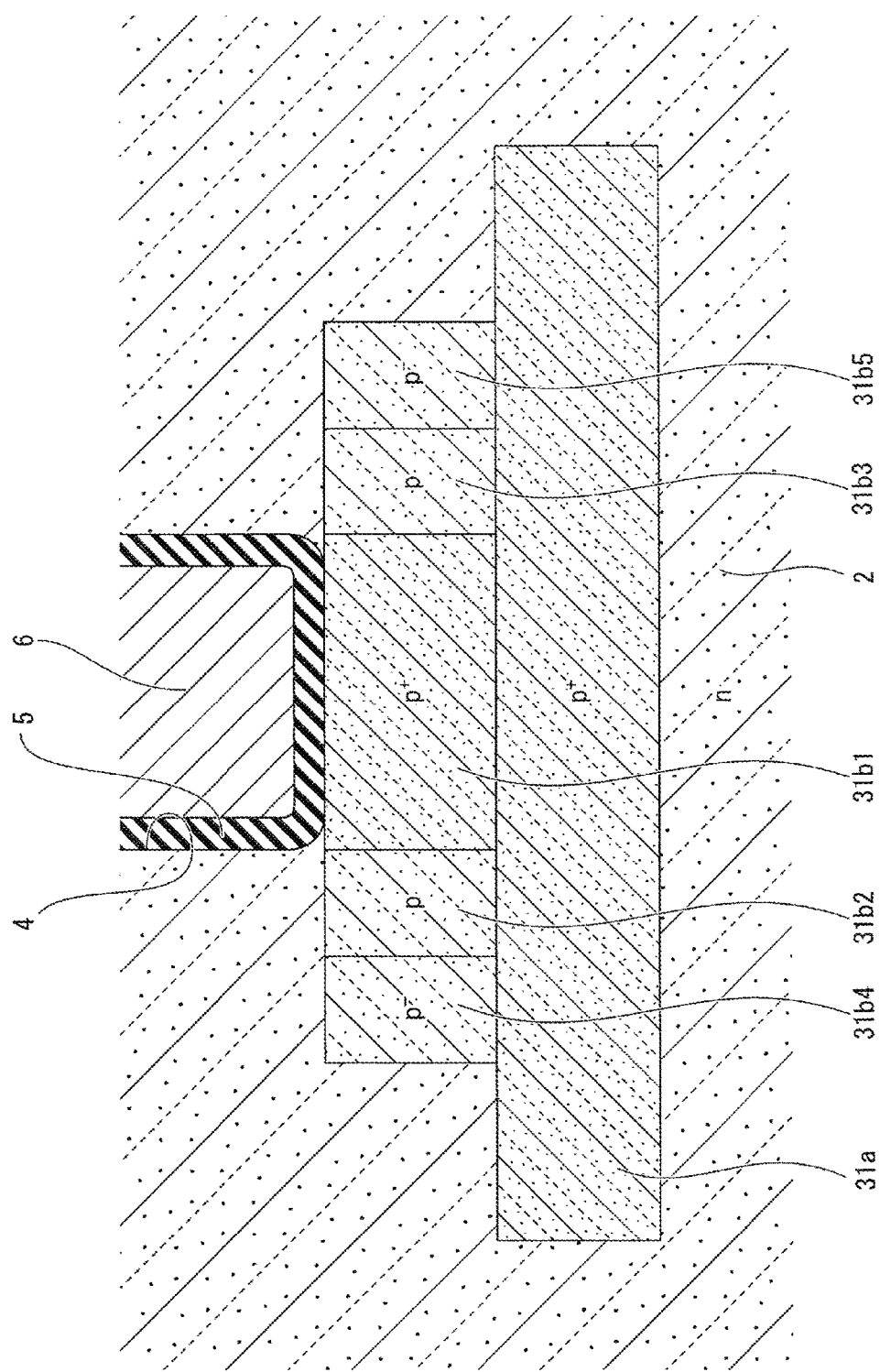
FIG. 21 is an enlarged partial cross-sectional view that schematically describes a general configuration of a semiconductor device of a third modification example of the embodiment in the present invention.

As in the semiconductor device of the third modification example shown in FIG. 21, the impurity element concentration inside a p-type conductive path formation layer (31b1 to 31b5) of which the top surface contacts the bottom of the trench 4 may be differed along the trench width direction of the trench 4 in even more stages than the second modification example. A protective conductive region (31a, 31b1 to 31b5) in the semiconductor device of the third modification example is a two-layer structure made of a protective layer 31a and a conductive path formation layer (31b1 to 31b5).

The conductive path formation layer (31b1 to 31b5) in the semiconductor device of the third modification example has a center protective region 31b1 provided in the center, and a left-side first conductive path formation region 31b2 provided to the left side of the center protective region 31b1 and contacting the center protective region 31b1. A left-side second conductive path formation region 31b4 is disposed next to the left-side first conductive path formation region 31b2 on the side of the left-side first conductive path formation region 31b2 opposite to the center protective region 31b1.

The conductive path formation layer (31b1 to 31b5) also has a right-side first conductive path formation region 31b3 disposed on the right side of the center protective region 31b1 and in contact with the center protective region 31b1. A right-side second conductive path formation region 31b5 is disposed next to the right-side first conductive path formation region 31b3 on the side of the right-side first conductive path formation region 31b3 opposite to the center protective region 31b1. The center protective region 31b1, left-side first conductive path formation region 31b2, left-side second conductive path formation region 31b4, right-side first conductive path formation region 31b3, and right-side second conductive path formation region 31b5 have all approximately the same thickness and the same conductivity type of p-type.

The center protective region 31b1 is provided directly below the trench 4 and above the protective layer 31a, has approximately the same width as the trench 4, and extends along the direction in which the trench 4 extends. The impurity element concentration of the center protective region 31b1 is configured such that the high-concentration p$^+$ type will be maintained without forming an inversion layer, even during ON.

The left-side first conductive path formation region 31b2 and left-side second conductive path formation region 31b4 extend along the direction in which the trench 4 extends, similar to the center protective region 31b1. The impurity element concentration of the left-side first conductive path formation region 31b2 is set to a low-concentration p-type such that the conductivity type inverts to n-type during ON. The impurity element concentration of the left-side second conductive path formation region 31b4 is set to a lower concentration p⁻ type than the left-side first conductive path formation region 31b2 such that the conductivity type inverts to n-type during ON.

The right-side first conductive path formation region 31b3 and right-side second conductive path formation region 31b5 are disposed so as to have left-right symmetry with the left-side first conductive path formation region 31b2 and left-side second conductive path formation region 31b4 about the center protective region 31b1. The impurity element concentrations of the right-side first conductive path formation region 31b3 and right-side second conductive path formation region 31b5 are both respectively set to low-concentration p-type and p⁻-type so as to have mirror symmetry with the left-side first conductive path formation region 31b2 and left-side second conductive path formation region 31b4. The right-side first conductive path formation region 31b3 and right-side second conductive path formation region 31b5 both have the conductivity types thereof that invert to n-type during ON, similar to the left-side first conductive path formation region 31b2 and left-side second conductive path formation region 31b4. Except for the conductive path formation layer (31b1 to 31b5), the structure of the semiconductor device in the third modification example is equivalent to the members of the same name in the semiconductor device shown in FIG. 1, and thus redundant explanations will be omitted.

Figure 22:
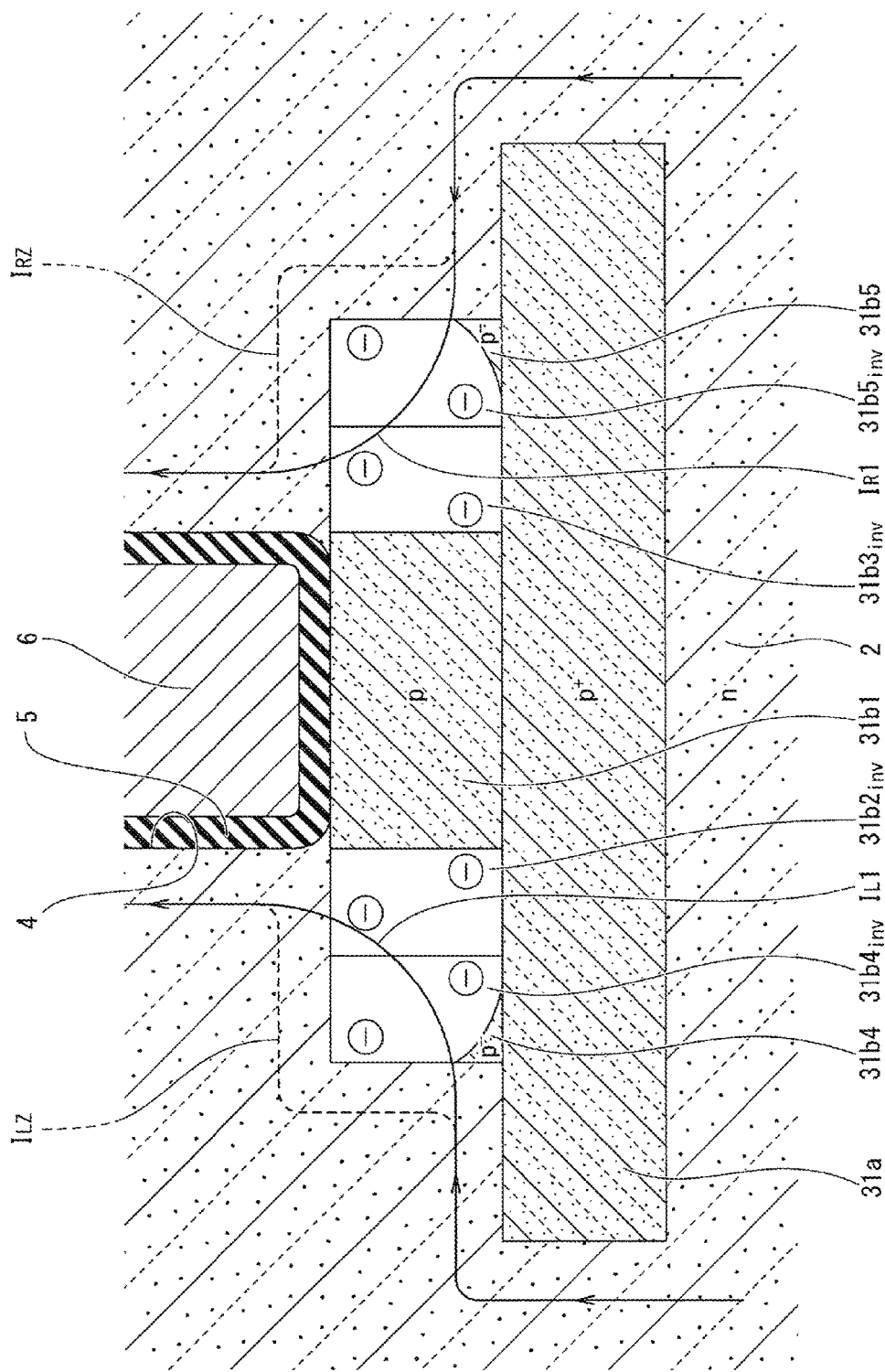
FIG. 22 is an enlarged partial cross-sectional view that schematically describes a general state of main currents flowing to the semiconductor device of the third modification example of the embodiment in the present invention.
Figure 23:
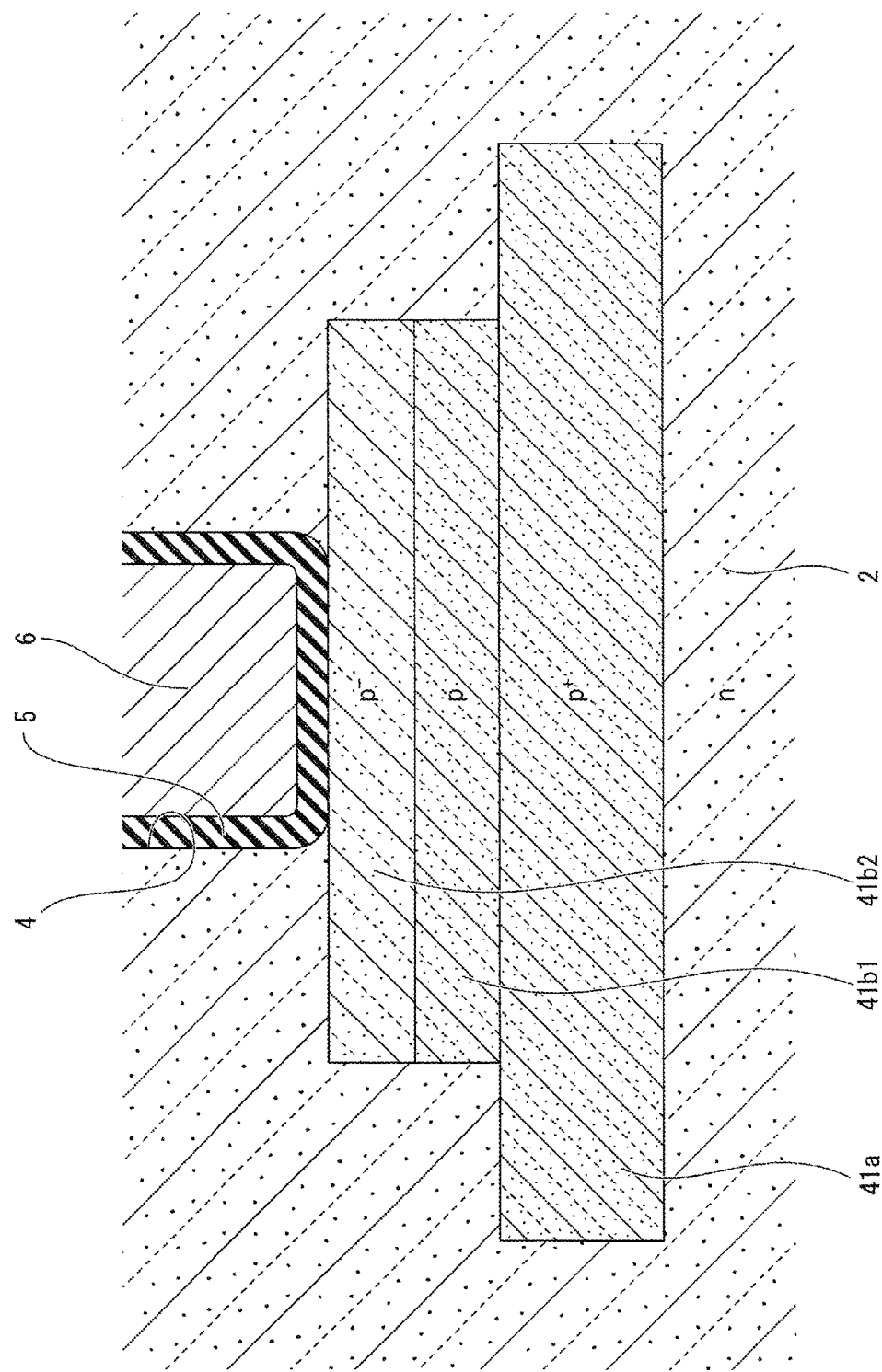
FIG. 23 is an enlarged partial cross-sectional view that schematically describes a general configuration of a semiconductor device of a fourth modification example of the embodiment in the present invention.

As shown in FIG. 22, in the semiconductor device of the third modification example, a gate voltage being applied during ON forms an inversion layer $31b2_{inv}$ in the left-side first conductive path formation region 31b2, similar to the channel regions 3a1, 3b1. An inversion layer $31b4_{inv}$ is also formed in the left-side second conductive path formation region 31b4. At the same time, an inversion layer $31b3_{inv}$ is formed in the right-side first conductive path formation region 31b3, and an inversion layer $31b5_{inv}$ is formed in the right-side second conductive path formation region 31b5. The inversion layer $31b2_{inv}$, inversion layer $31b3_{inv}$, inversion layer $31b4_{inv}$, and inversion layer $31b5_{inv}$ form paths that conduct main currents $I_L1$, $I_R1$, similar to the inversion layer $11b1_{inv}$ in the conductive path formation layer 11b in the semiconductor device shown in FIG. 1.

Similar to above, in the semiconductor device of the third modification example, the main currents $I_L1$, $I_R1$ flow from the bottom side of the drift region 2 to toward the channel regions 3a1, 3b1. Both ends of the conductive path formation layer (31b1 to 31b5) are formed in a position interfering with the paths of the main currents $I_L1$, $I_R1$ during ON. In the third modification example, the left-side first conductive path formation region 31b2 and left-side second conductive path formation region 31b4 are formed on the left end side of the conductive path formation layer (31b1 to 31b5). Furthermore, the right-side first conductive path formation region 31b3 and right-side second conductive path formation region 31b5 are formed on the right end side of the conductive path formation layer (31b1 to 31b5). The left-side first conductive path formation region 31b2, left-side second conductive path formation region 31b4, right-side first conductive path formation region 31b3, and right-side second conductive path formation region 31b5 all have the conductivity types thereof that invert during ON. Accordingly, the main currents $I_L1$, $I_R1$ are guided toward the side walls of the trench 4 during ON and can pass through shorter paths, thus making it possible to reduce ON-resistance of the semiconductor device.

Furthermore, in the third modification example in which the concentration of the impurity element of the conductive path formation layer (31b1 to 31b5) decreases from the center along the directions toward the outside, it is possible to arrange the high-concentration center protective region 31b1 directly below the bottom of the trench 4. This makes it possible to further strengthen the protection of the gate insulating film 5 during OFF, similar to the first modification example. The other effects of the semiconductor device of the third modification example are similar to the semiconductor device of the embodiment in the present invention shown in FIG. 1.

Fourth Modification Example

In the second modification example and third modification example, the conductive path formation layer, which has a plurality of regions therein, was configured such that the impurity element concentration of the region in the center corresponding to the center of the trench 4 was greatest, and the concentration of the regions became lower from the center along the directions going toward outside. However, as in the semiconductor device of the fourth modification example shown in FIG. 23, the impurity element concentration inside a p-type conductive path formation layer (41b1, 41b2) of which the top surface is provided in contact with the bottom of the trench 4 may be differed along the depth direction of the trench 4. A protective conductive region (41a, 41b1, 41b2) in the semiconductor device of the fourth modification example is a two-layer structure made of a protective layer 41a and a conductive path formation layer (41b1, 41b2).

The conductive path formation layer (41b1, 41b2) has a p-type bottom-side conductive path formation region 41b1 positioned on the bottom side of the two layers on the protective layer 41a, and a low-concentration p⁻-type top-side conductive path formation region 41b2 disposed above the bottom-side conductive path formation region 41b1. The bottom-side conductive path formation region 41b1 has both ends protruding to outside of the trench 4, and extends along the direction in which the trench 4 extends.

The impurity element concentration of the bottom-side conductive path formation region 41b1 is set to a low concentration at which the conductivity type inverts to n-type during ON. The top-side conductive path formation region 41b2 has approximately the same thickness as the bottom-side conductive path formation region 41b1 and extends along the direction in which the trench 4 extends, similar to the bottom-side conductive path formation region 41b1. The impurity element concentration of the top-side conductive path formation region 41b2 is set to an even lower concentration than the bottom-side conductive path formation region 41b1, such that the conductivity type inverts to n-type during ON. Except for the conductive path formation layer (41b1, 41b2), the structure of the semiconductor device in the fourth modification example is equivalent to the members of the same name in the semiconductor device shown in FIG. 1, and thus redundant explanations will be omitted.

Figure 24:
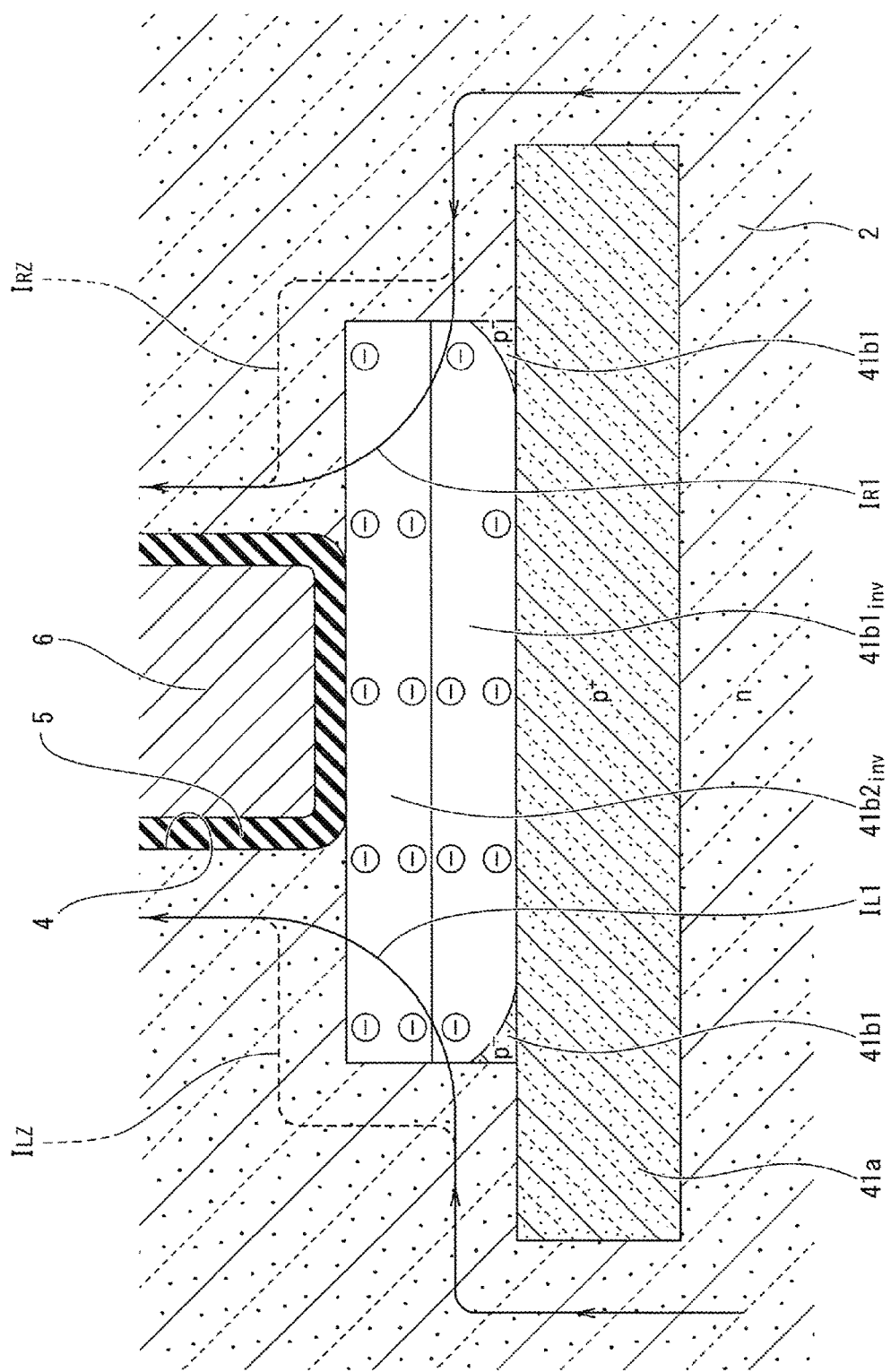
FIG. 24 is an enlarged partial cross-sectional view that schematically describes a general state of main currents flowing to the semiconductor device of the fourth modification example of the embodiment in the present invention.

As shown in FIG. 24, in the semiconductor device of the fourth modification example, a gate voltage is applied during ON to form an inversion layer $41b1_{inv}$ in the bottom-side conductive path formation region 41b1, similar to the channel regions 3a1, 3b1. An inversion layer $41b2_{inv}$ is also formed in the top-side conductive path formation region 41b2. The inversion layer $41b1_{inv}$ and inversion layer $41b2_{inv}$ form paths that conduct main currents $I_L1$, $I_R1$, similar to the inversion layer $11b1_{inv}$ of the conductive path formation layer 11b in the semiconductor device shown in FIG. 1.

As above, in the semiconductor device of the fourth modification example, both ends of the conductive path formation layer (41b1, 41b2) are positioned in positions interfering with the paths of the main currents $I_L1$, $I_R1$ during ON. The main currents $I_L1$, $I_R1$ flow from the bottom side of the drift region 2 toward the channel regions 3a1, 3b1. In the fourth modification example, the bottom-side conductive path formation region 41b1 and top-side conductive path formation region 41b2, of which the conductivity types invert during ON, are provided at both ends of the conductive path formation layer (41b1, 41b2). Accordingly, the main currents $I_L1$, $I_R1$ are guided toward the side walls of the trench 4 and can pass through shorter paths, thus making it possible to reduce ON-resistance of the semiconductor device.

The concentration of the impurity element of the conductive path formation layer (41b1, 41b2) becomes higher from the position contacting the bottom of the trench 4 toward the bottom side, thereby making it possible to increase the concentration of the entire p-type semiconductor region on the side positioned on the bottom side of the trench 4. This makes it possible to further strengthen the protection of the gate insulating film 5 during OFF. The other effects of the semiconductor device of the fourth modification example are similar to the semiconductor device of the embodiment in the present invention shown in FIG. 1. The present invention is not limited to the two layers shown in modification example 4 with respect to a structure of the conductive path formation layer in which the inside thereof is divided into a plurality of regions in the vertical direction. The structure can also be obtained by a conductive path formation layer having a plurality of regions in three or more layers, in which the impurity element concentration of each region becomes higher as the position becomes deeper.

Fifth Modification Example

Figure 25:
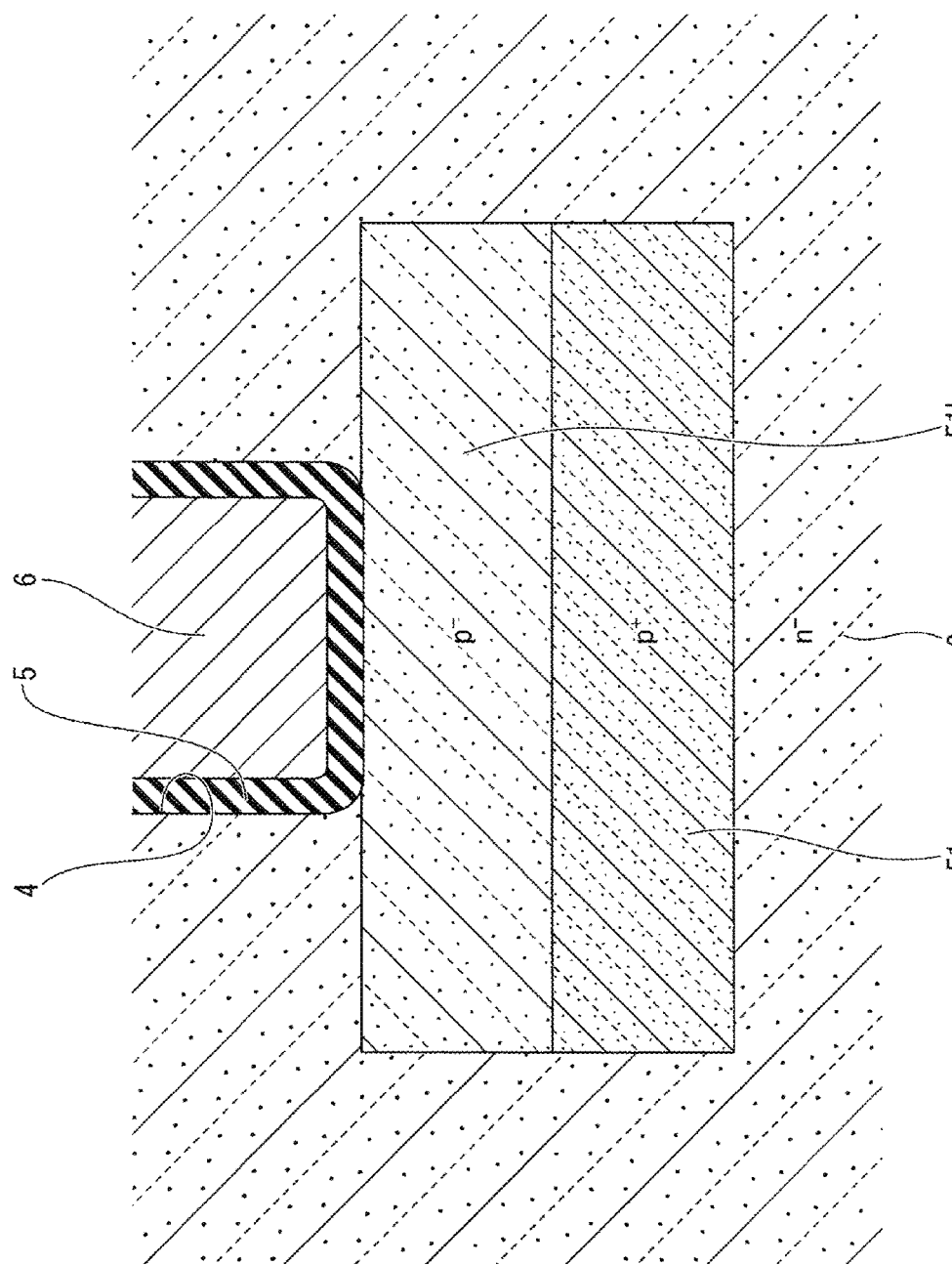
FIG. 25 is an enlarged partial cross-sectional view that schematically describes a general configuration of a semiconductor device of a fifth modification example of the embodiment in the present invention.

As in the semiconductor device of the fifth modification example shown in FIG. 25, the protruding width of a protective layer 51a may be equal to the protruding width of a conductive path formation layer 51b, and the outer edges of a cross-sectional shape of a protective conduction region (51a, 51b) made of the protective layer 51a and conductive path formation layer 51b may be a rectangular shape. The impurity element concentration of the conductive path formation layer 51b is set to a low-concentration p$^-$-type where the conductivity type inverts to n-type during ON. Except for the conductive path formation layer 51b, the structure of the semiconductor device in the fifth modification example is equivalent to the members of the same name in the semiconductor device shown in FIG. 1, and thus redundant explanations will be omitted.

Figure 26:
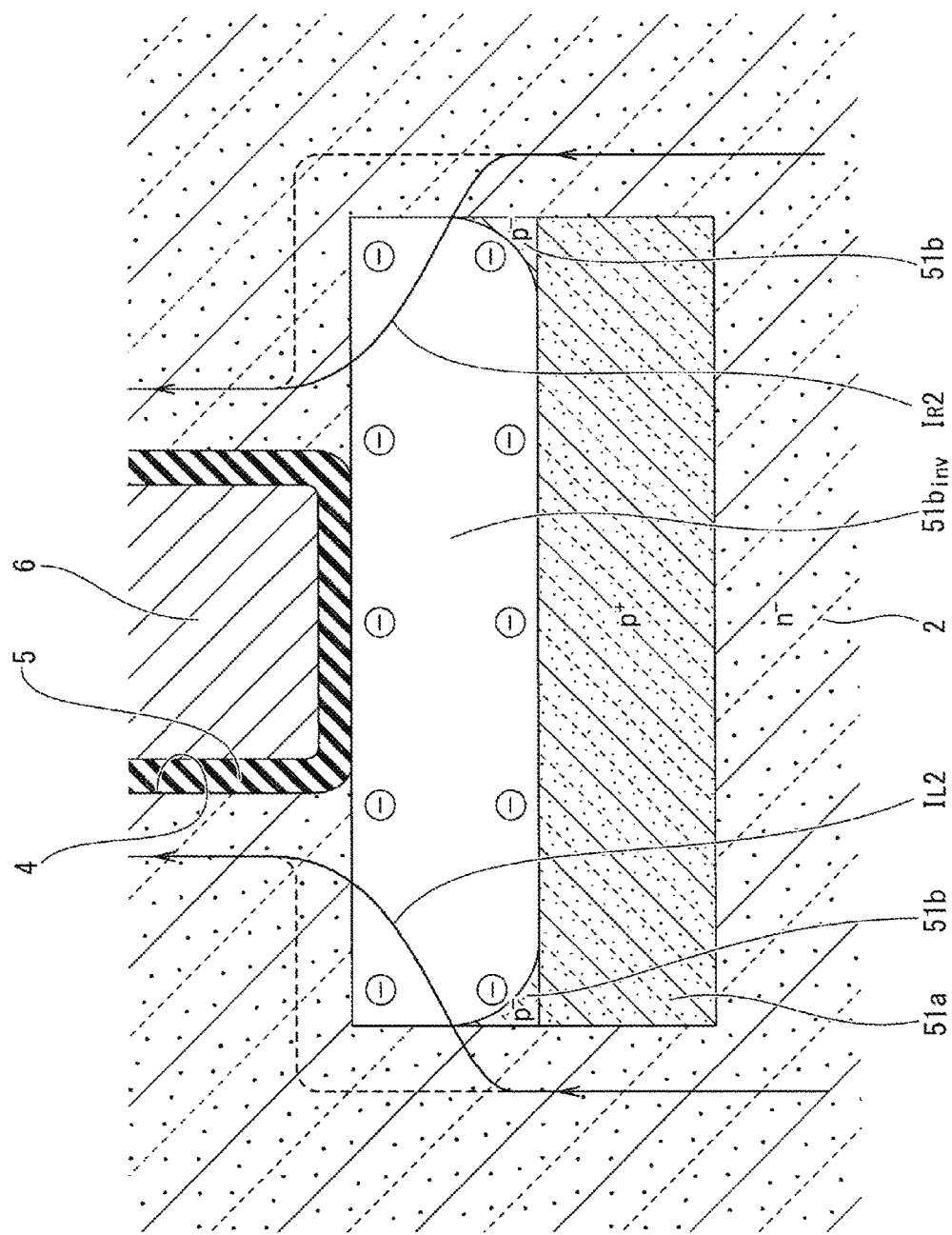
FIG. 26 is an enlarged partial cross-sectional view that schematically describes a general state of main currents flowing to the semiconductor device of the fifth modification example of the embodiment in the present invention.

As shown in FIG. 26, in the semiconductor device of the fifth modification example, a gate voltage being applied during ON forms an inversion layer $51b_{inv}$ in the conductive path formation layer 51b, similar to the channel regions 3a1, 3b1. The inversion layer $51b_{inv}$ forms paths that conduct main currents $I_L2$, $I_R2$, similar to the inversion layer $11b_{inv}$ of the conductive path formation layer 11b in the semiconductor device shown in FIG. 1.

As above, in the semiconductor device of the fifth modification example, both ends of the conductive path formation layer 51b are positioned in positions interfering with the paths of the main currents $I_L2$, $I_R2$ during ON. The main currents $I_L2$, $I_R2$ flow from the bottom side of the drift region 2 toward the channel regions 3a1, 3b1. In the fifth modification example, the inversion layer $51b_{inv}$ is formed including both ends of the conductive path formation layer 51b during ON. Thus, the main currents $I_L2$, $I_R2$ are guided toward the side walls of the trench 4 and can pass through shorter paths, thus making it possible to reduce ON-resistance of the semiconductor device. The other effects of the semiconductor device of the fifth modification example are similar to the semiconductor device of the embodiment in the present invention shown in FIG. 1.

As in the semiconductor device of the fifth modification example, the entire shape of the protective conduction region is not limited to having both ends being a step-like shape, but rather can be modified as appropriate, as long as an inversion layer is formed during ON in positions interfering with the paths through which the main currents $I_L1$, $I_R1$ flow at the bottom of the trench 4.

Other Embodiments

The present invention was described by the embodiment and its modification examples disclosed above, but the description and drawings that form a part of the disclosure should not be construed as limiting the present invention. Various substitute embodiments, working examples, and uses shall be clear to a person skilled in the art from the present disclosure.

Furthermore, the structure of the semiconductor device of the present invention is not limited to the description above and can be modified as necessary in accordance with the desired specifications. For example, in addition to the structure of the semiconductor device shown in FIG. 1, it is possible to additionally provide a high-concentration n-type region as a counter doping layer at a position on the bottom side of the base regions 3a, 3b inside the drift region 2 at a depth containing the protective conductive region (11a, 11b). By providing the high-concentration counter-doping layer, it is possible to further protect the gate insulating film 5 at the bottom of the trench 4 by intentionally causing an electric field to be concentrated at the counter-doping layer rather than the trench 4 side, thereby guiding the avalanche current. When the high-concentration n-type region is to be provided, the concentration of the p-type impurity element to be added is set to greater than or equal to the concentration of the impurity element of the high-concentration n-type region, such that the conductive path formation layer 11b is able to be maintained as p-type during OFF.

Furthermore, in the method of manufacturing the semiconductor device of the embodiment in the present invention, the region of the second mask film 17 corresponding to the bottom of the trench 4 was removed during forming of the conductive path formation layer 11b by ion implantation. However, the present invention is not limited to this, and it is also possible to form the conductive path formation layer 11b by performing ion implantation without removing the region of the second mask film 17 corresponding to the bottom of the trench 4, i.e., while the region of the second mask film 17 is still present. By not having a step for partially removing the second mask film 17, it is possible to simplify the manufacturing process.

Moreover, in the method of manufacturing the semiconductor device of the embodiment in the present invention, an example was shown in which the protective layer 11a and conductive path formation layer 11b are formed by ion implantation in the vertical direction, as shown in FIG. 7 and FIG. 12. However, in the present invention, the ion implantation direction is not limited to being vertical, and oblique ion implantation can also be performed. For example, the desired protruding width can be obtained by oblique ion implantation even if the intended protruding widths of each of the protective layer 11a and conductive path formation layer 11b are insufficient with only ion implantation in the vertical direction due to a very small diffusion coefficient of SiC impurities. During oblique ion implantation, the side walls of the trench would be protected by a mask or the like, thereby preventing the side wall portions from being irradiated by ions and suppressing degradation in quality.

Furthermore, during diffusion in the forming of the protective layer 11a, conductive path formation layer 11b, etc., diffusion can also be promoted via photoexcitation action by emitting ultraviolet light such as an excimer laser at an inclination angle that is similar to the oblique ion implantation, for example. The promotion of diffusion by the photoexcitation action or the like is useful in cases such as where the protective layer 11a and conductive path formation layer 11b cannot be sufficiently diffused via only a thermal treatment due to the diffusion coefficient of the SiC impurities being very small.

In the method of manufacturing the semiconductor device of the embodiment in the present invention, the base regions 3a, 3b were formed by using ion implantation, but the present invention is not limited to ion implantation, and it is also possible to form the base regions by an epitaxial growth method or the like. In the case of an epitaxial growth method, as above, the concentration of the doping epitaxy of the channel region of the base region is adjusted to be higher than the concentration of the impurity element ions of the conductive path formation layer to realize a low concentration of the conductive path formation layer so that the conductive path formation layer forms an inversion layer during ON.

The semiconductor device of the present invention can be realized even when parts of the structure of the semiconductor devices shown in FIGS. 1 to 26 are combined. As described above, the present invention includes various embodiments and modification examples not disclosed above, and the technical scope of the present invention is determined solely by the invention-defining matters within a reasonable scope of the claims from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a drift region of a first conductivity type made of semiconductor;
   a base region of a second conductivity type made of semiconductor, disposed above the drift region, wherein a trench is provided penetrating the base region and reaching the drift region;
   a gate insulating film disposed inside of the trench;
   a gate electrode embedded inside the trench with the gate insulating film interposed between the trench and the gate electrode;
   a first high-impurity region of the first conductivity type disposed above the base region;
   a second high-impurity region of the first conductivity type disposed below the drift region;
   a protective layer of the second conductivity type that is disposed inside the drift region below a bottom of the trench, the protective layer protruding laterally beyond a width of the trench on both sides; and
   a conductive path formation layer of the second conductivity type that is disposed between, and in contact with, the protective layer and the bottom of the trench, the conductive path formation layer having protruding regions that protrude laterally beyond the width of the trench on both sides, an impurity concentration of the protruding regions being such that an inversion layer is formed therein when the semiconductor device is turned on to form an inversion layer in a portion of the base region opposing to the gate electrode, the conductive path formation layer being provided along an entire bottom of the trench in an extending direction of the trench that is perpendicular to a direction of the width of the trench,
   wherein a thickness of the conductive path formation layer is 10 nm or less.

2. The semiconductor device according to claim 1, wherein an impurity concentration of the base region is greater than the impurity concentration of the conductive path formation layer.

3. The semiconductor device according to claim 1, wherein an impurity concentration of the protective layer and the impurity concentration of the conductive path formation layer are the same.

4. The semiconductor device according to claim 1, wherein the impurity concentration the conductive path formation layer decreases from a center in a lateral direction of the conductive path formation layer towards peripheries of the conductive path formation layer in the lateral direction.

5. A semiconductor device, comprising:
   a drift region of a first conductivity type made of semiconductor;
   a base region of a second conductivity type made of semiconductor, disposed above the drift region, wherein a trench is provided penetrating the base region and reaching the drift region;
   a gate insulating film disposed inside of the trench;
   a gate electrode embedded inside the trench with the gate insulating film interposed between the trench and the gate electrode;
   a first high-impurity region of the first conductivity type disposed above the base region;
   a second high-impurity region of the first conductivity type disposed below the drift region;
   a protective layer of the second conductivity type that is disposed inside the drift region below a bottom of the trench, the protective layer protruding laterally beyond a width of the trench on both sides; and
   a conductive path formation layer of the second conductivity type that is disposed between, and in contact with, the protective layer and the bottom of the trench, the conductive path formation layer having protruding regions that protrude laterally beyond the width of the trench on both sides, an impurity concentration of the protruding regions being such that an inversion layer is formed therein when the semiconductor device is turned on to form an inversion layer in a portion of the base region opposing to the gate electrode, the conductive path formation layer being provided along an entire bottom of the trench in an extending direction of the trench that is perpendicular to a direction of the width of the trench, wherein the impurity concentration of the conductive path formation layer increases from a top of the conductive path formation layer towards a bottom of the conductive path formation layer.

6. A method of manufacturing a semiconductor device, the method comprising:

forming a base region of a second conductivity type made of semiconductor, above a drift region of a first conductivity type made of semiconductor;

forming a trench penetrating the base region and reaching the drift region;

forming a gate insulating film along the trench;

forming a gate electrode inside the trench with the gate insulating film interposed between the trench and the gate electrode;

forming a first high-impurity region of the first conductivity type above the base region;

forming a second high-impurity region of the first conductivity type below the drift region;

forming a protective layer of the second conductivity type inside the drift region below a bottom of the trench such that the protective layer protrudes laterally beyond a width of a trench on both sides; and forming a conductive path formation layer of the second conductivity type between, and in contact with, the protective layer and the bottom of the trench, the conductive path formation layer having protrusion regions that protrude laterally beyond the width of the trench on both sides, an impurity concentration of the protrusion regions being such that an inversion layer is formed therein when the semiconductor device is turned on to form an inversion layer in a portion of the base region opposing to the gate electrode, the conductive path formation layer being provided along an entire bottom of the trench in an extending direction of the trench that is perpendicular to a direction of the width of the trench, wherein the method further comprises forming a below-contact base region of the second conductivity type inside the drift region at a location laterally separated from the trench at approximately the same depth as the conductive path formation layer, and wherein the forming of the conductive path formation layer and the forming of the below-contact base region are performed separately.

7. The method of manufacturing the semiconductor device according to claim 6, wherein the forming of the protective layer and the forming of the conductive path formation layer are performed such that impurity concentrations of the protective layer and the conductive path formation layer are the same.

8. The method of manufacturing the semiconductor device according to claim 6, wherein the forming of the conductive path formation layer is performed after the forming of the trench.

9. The method of manufacturing the semiconductor device according to claim 6, wherein the forming of the conductive path formation layer is performed such that a top surface of the conductive path formation layer contacts the gate insulating film at the bottom of the trench.

10. The method of manufacturing the semiconductor device according to claim 9, wherein the forming of the base region is performed by implantation of impurity ions of the second conductivity type into an upper portion of a semiconductor layer of the first conductivity type, a remaining portion of the semiconductor layer being the drift layer, and wherein a dosage amount of impurity ions during forming of the conductive path formation layer is lower than a peak dosage of the impurity element ions during the forming of the base region.

11. The method of manufacturing the semiconductor device according to claim 6, wherein the forming of the trench includes forming a mask over the base layer exposing a portion of the base layer where the trench is to be formed and removing the exposed portion of the base layer to form the trench, and wherein the forming of the protective layer is performed using said mask that has been used in forming the trench.

* * * * *